(12) United States Patent
Khaderbad et al.

(10) Patent No.: US 11,488,869 B2
(45) Date of Patent: Nov. 1, 2022

(54) TRANSISTOR ISOLATION STRUCTURES

(71) Applicant: TAIWAN SEMICONDUCTOR MANUFACTURING CO., LTD., Hsinchu (TW)

(72) Inventors: Mrunal Abhijith Khaderbad, Hsinchu (TW); Keng-Chu Lin, Ping-Tung (TW); Yu-Yun Peng, Hsinchu (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 0 days.

(21) Appl. No.: 17/075,863

(22) Filed: Oct. 21, 2020

(65) Prior Publication Data
US 2022/0123152 A1  Apr. 21, 2022

(51) Int. Cl.
*H01L 21/8234* (2006.01)
*H01L 29/786* (2006.01)
(Continued)

(52) U.S. Cl.
CPC .......... *H01L 21/823431* (2013.01); *H01L 21/02532* (2013.01); *H01L 21/02603* (2013.01); *H01L 21/30604* (2013.01); *H01L 21/31116* (2013.01); *H01L 21/823468* (2013.01); *H01L 29/0673* (2013.01); *H01L 29/42392* (2013.01); *H01L 29/4908* (2013.01); *H01L 29/4991* (2013.01); *H01L 29/6653* (2013.01);
(Continued)

(58) Field of Classification Search
CPC ......... H01L 21/02532; H01L 21/02603; H01L 21/02606; H01L 21/30604; H01L 21/31116; H01L 21/823412; H01L 21/823418; H01L 21/823431; H01L 21/823468; H01L 21/823821; H01L 21/823864; H01L 29/0673; H01L 29/42392; H01L 29/4908; H01L 29/4991; H01L 29/6653; H01L 29/66545; H01L 29/66553; H01L 29/66742; H01L 29/785; H01L 29/78618; H01L 29/78696; B82Y 40/00

See application file for complete search history.

(56) References Cited

U.S. PATENT DOCUMENTS 10,453,824 B1 * 10/2019 Mochizuki ........ H01L 21/02507
2020/0066508 A1 * 2/2020 Doris ................ H01L 29/66545

* cited by examiner

*Primary Examiner* — Cheung Lee
(74) *Attorney, Agent, or Firm* — Sterne, Kessler, Goldstein & Fox P.L.L.C.

(57) ABSTRACT

The present disclosure is directed to method for the fabrication of spacer structures between source/drain epitaxial structures and metal gate structures in nanostructure transistors. The method includes forming a fin structure with alternating first and second nanostructure elements on a substrate. The method also includes etching edge portions of the first nanostructure elements in the fin structure to form spacer cavities, and depositing a spacer layer on the fin structure to fill the spacer cavities. Further, treating the spacer layer with a microwave-generated plasma to form an oxygen concentration gradient within the spacer layer outside the spacer cavities and removing, with an etching process, the treated portion of the spacer layer. During the etching process, a removal rate of the etching process for the treated portion of the spacer layer is based on an oxygen concentration within the oxygen concentration gradient.

20 Claims, 19 Drawing Sheets

(51) Int. Cl.
*H01L 29/06* (2006.01)
*H01L 29/423* (2006.01)
*H01L 29/49* (2006.01)
*H01L 29/66* (2006.01)
*H01L 21/02* (2006.01)
*H01L 21/306* (2006.01)
*H01L 21/311* (2006.01)

(52) U.S. Cl.
CPC .. *H01L 29/66545* (2013.01); *H01L 29/66553* (2013.01); *H01L 29/66742* (2013.01); *H01L 29/78618* (2013.01); *H01L 29/78696* (2013.01)

TRANSISTOR ISOLATION STRUCTURES

BACKGROUND

Gate-all-around (GAA) field effect transistors (GAA-FETs), such as nano-sheet or nano-wire GAA-FETs, have improved gate control over their channel regions compared to other types of FETs whose gate structure covers sidewall portions and top surfaces of semiconductor fin structures. Due to their gate-all-around geometry, GAA nano-sheet or nano-wire FETs achieve larger effective channel widths and higher drive currents.

BRIEF DESCRIPTION OF THE DRAWINGS

Aspects of the present disclosure are best understood from the following detailed description when read with the accompanying figures.

DETAILED DESCRIPTION

Figure 1:
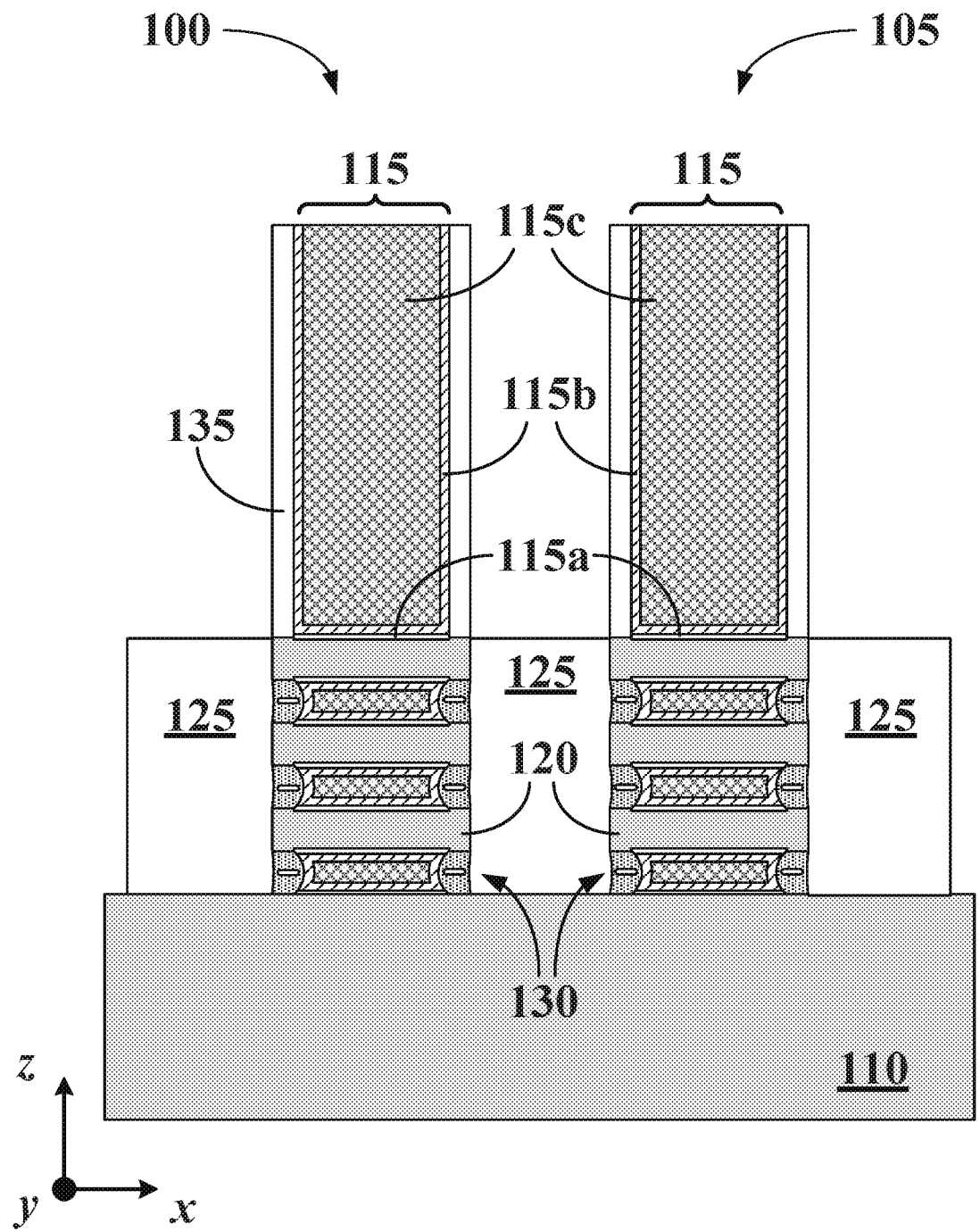
FIG. 1 is a cross-sectional view of nanostructure transistors, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over a second feature in the description that follows may include embodiments in which the first and second features are formed in direct contact, and may also include embodiments in which additional features may be formed that are between the first and second features, such that the first and second features are not in direct contact.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may he otherwise oriented (rotated 90 degrees or at other orientations) and the spatially relative descriptors used herein may likewise be interpreted accordingly.

In some embodiments, the terms "about" and "substantially" can indicate a value of a given quantity that varies within 5% of the value (e.g., ±1%, ±2%, ±3%, ±4%, ±5% of the value). These values are merely examples and are not intended to be limiting. It is to be understood that the terms "about" and "substantially" can refer to a percentage of the values as interpreted by those skilled in relevant art(s) in light of the teachings herein.

By way of example and not limitation, nanostructure transistors, like GAA nano-sheet (NS) or nano-wire (NW) FETs (collectively referred to as "GAA FETs") with nano-sheet (NS) or nano-wire (NW) channel regions, can be formed as follows. A fin-like structure with alternating silicon-germanium (SiGe) and silicon (Si) NS or NW layers is formed on a substrate (e.g., on semiconductor substrate). A sacrificial gate structure is then formed on a middle portion of the fin-like structure to cover top and sidewall surfaces of the fin-like structure so that edge portions of the fin-like structure are not covered by the sacrificial gate structure. The edge portions of the fin-like structure not covered by the sacrificial gate structure are removed. Subsequently, edge portions of the SiGe NS or NW layers are recessed with respect to edge portions of the Si NS or NW layers, and a spacer material is deposited to fill the space formed by the etched portions of the SiGe NS or NW layers. An oxidation process, which can include a steam anneal or plasma oxidation with oxygen ions, partially oxidizes the spacer material. The oxidized spacer material is selectively removed with an etching process selective to the oxidized spacer material (e.g., with diluted hydrofluoric acid (DHF)). Un-etched portions of the spacer material (e.g., the non-oxidized portions of the spacer material) form spacer structures that cover the etched portions of the SiGe NS or NW layers. Source/drain (S/D) epitaxial structures are then formed to abut edge portions of the fin-like structures so that the S/D epitaxial structures are in contact with the Si NS or NW layers and isolated from the SiGe NS or NW layers by the spacer structures. At a later operation, the sacrificial gate structure is removed to expose the top and sidewall surfaces of the fin-like structure. The SiGe NS or NW layers are selectively removed from the fin-like structure. During the selective removal process, the Si NS or NW layers and the spacer structures are not removed. Subsequently, a metal gate structure is formed to surround the Si NS and NW layers. Similar to the SiGe NS or NW layers prior to their selective removal, the metal gate structure is isolated from the S/D epitaxial structures through the spacer structures.

During the exemplary GAA-FET formation process described above, the oxidation process used to oxidize the spacer material may also oxidize portions of the SiGe and Si NS or NW layers near the interface with the spacer material. This means that the oxidation process may extend beyond the spacer material to the Si and SiGe NS and NW layers. This undesirable oxidation of the SiGe NS or NW layers can result in complications during the removal process of the SiGe NS or NW layers. Further, the undesirable oxidation of the Si NS or NW layers can result in formation of a dielectric barrier (e.g., silicon oxide) between the Si NS and NW layers and the S/D epitaxial structures. Even if the oxidized portions of the SiGe and Si NS or NW layers are removed, the Si NS or NW layers would lose material. This material loss reduces the transistor's effective channel length, which can be detrimental to the transistor's performance. In addition, the oxidized amount in the Si NS or NW layers cannot be effectively controlled, which introduces undesirable process variability.

The embodiments described herein are directed to treatments for the spacer material with oxygen and nitrogen radicals to convert portions of the spacer material to an oxide or a nitride, which can be selectively removed during a subsequent etching process with DHF. In some embodiments, the treatment described herein offers improved oxidation control compared to a steam anneal process or a plasma oxidation process with oxygen ions. In some embodiments, the treatment process with oxygen or nitrogen radicals described herein is performed at a low temperature (e.g., lower than that of a steam anneal or of a plasma oxidation with oxygen ions) that mitigates or eliminates Si and SiGe NS or NW layer oxidation. In some embodiments, the treatment process with oxygen or nitrogen radicals described herein can provide a more co-planar surface topography for the spacer structure compared to steam anneal or ion plasma oxidation methods. In some embodiments, the methods described herein can be used to form a porous spacer material.

According to some embodiments, FIG. 1 is a cross-sectional view of GAA-FETs 100 and 105 formed on a substrate 110. Each of GAA-FETs 100 and 105 includes a gate structure 115, which surrounds Si NS or NW layers 120. By way of example and not limitation, each gate structure 115 includes a dielectric stack formed by an interfacial dielectric layer 115a and a high-k dielectric 115b. Further, each gate structure 115 includes a gate electrode 115c with capping layers, one or more work function metallic layers, and a metal fill not individually shown in FIG. 1 for simplicity.

Further, GAA-FETs 100 and 105 include source/drain (S/D) epitaxial structures 125 in contact with Si NS or NW layers 120. Each S/D epitaxial structure 125 includes one or more doped epitaxial layers, which are successively formed on substrate 110. In some embodiments, S/D epitaxial structures 125 are electrically isolated from gate structures 115 via spacer structures 130. Spacer structures 130 further separate Si NS or NW layers 125 in the vertical direction (e.g., along the z-direction) as shown in FIG. 1.

In some embodiments, sidewall surfaces of gate structures 115 in GAA-FETs 100 and 105 are covered by gate spacers 135, which provide structural support during the formation of gate structures 115. In addition, gate spacers 135 provide gate structures 115 with electrical isolation and protection during the formation of S/D contacts, which are not shown in FIG. 1.

In some embodiments, GAA-FETs 100 and 105 can be either n-type or p-type (e.g., pFETs or nFETs). Additional GAA-FETs, similar to the GAA-FETs shown in FIG. 1, can be formed over substrate 110. These additional GAA-FETs are within the spirit and the scope of this disclosure. By way of example and not limitation, p-type GAA FETs have S/D epitaxial structures 125 with boron-doped (B-doped) silicon-germanium (SiCi-e) layers, B-doped germanium (Ge) layers, B-doped germanium-tin (GeSn) layers, or combinations thereof. In some embodiments, n-type GAA FETs have S/D epitaxial structures 125 with arsenic (As)-doped silicon layers (Si—As), phosphorous (P)-doped silicon layers (Si—P), carbon-containing silicon layers (Si—C), or combinations thereof. In some embodiments, S/D epitaxial structures 125 are grown directly on top surfaces of substrate 110.

In some embodiments, spacer structures 130 are formed with a silicon oxide based material (e.g., silicon oxy-carbon nitride ($SiO_xC_yN_z$)) treated with oxygen radicals (O*) or nitrogen radicals (N*) and subsequently etched to form spacer structures 130. In some embodiments, spacer structures 130 include a dielectric material with a dielectric constant k less than about 3.9 (e.g., about 2.9), such as a porous material or a carbon-rich silicon oxide based dielectric. In some embodiments, the treatment with O* or N* is achieved with a microwave plasma operating at a frequency of about 2.45 GHz. In some embodiments, the process temperature during the treatment is less than about 400° C., which is lower than that of an oxidation steam anneal. The treatment with O* or N* achieves a high electron density (e.g., about $10^{12}$ electrons/cm$^{-3}$), low plasma damage, and a lower activation energy (e.g., requires a lower process temperature) compared to radio frequency (RF) plasma alternatives operating at 13.56 MHz.

In some embodiments, the treatment with O* or N* oxidizes or nitridizes the outer surfaces of the spacer material in a conformal manner for a controlled removal of the oxidized or nitridized portions with a wet etching chemistry, such as UHF. In some embodiments, treatments with O* provide improved control over the penetration depth within the spacer material and for this reason prevent undesirable Si and SiGe NS or NW oxidation. Further, the treatment with O* or N* reduces the surface topography of the spacer structure after the aforementioned spacer material removal process.

Figure 2A:
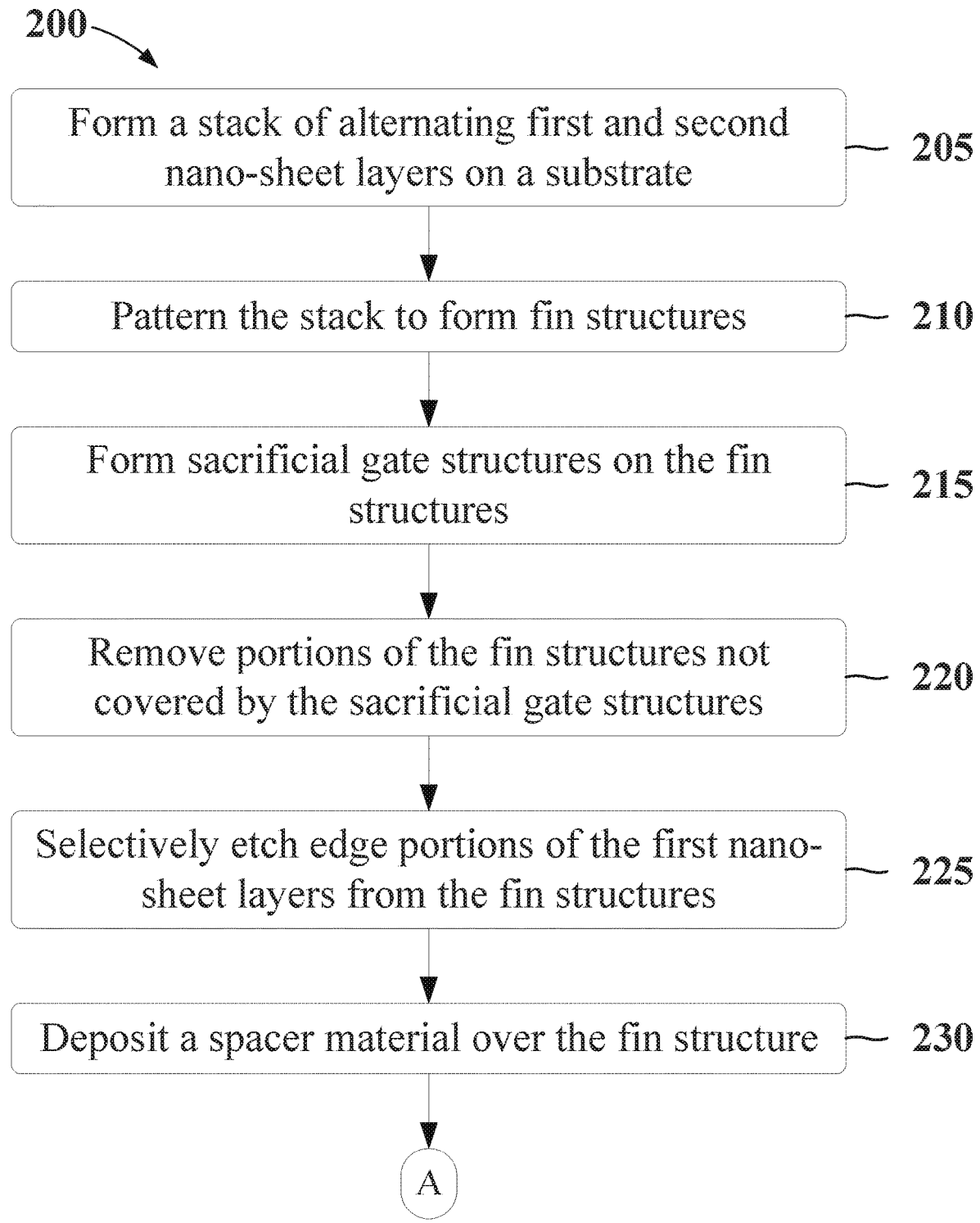
FIGS. 2A and 2B are flow charts of a fabrication method for the formation of spacer structures between gate structures and source/drain epitaxial structures of nanostructure transistors, in accordance with some embodiments.
Figure 2B:
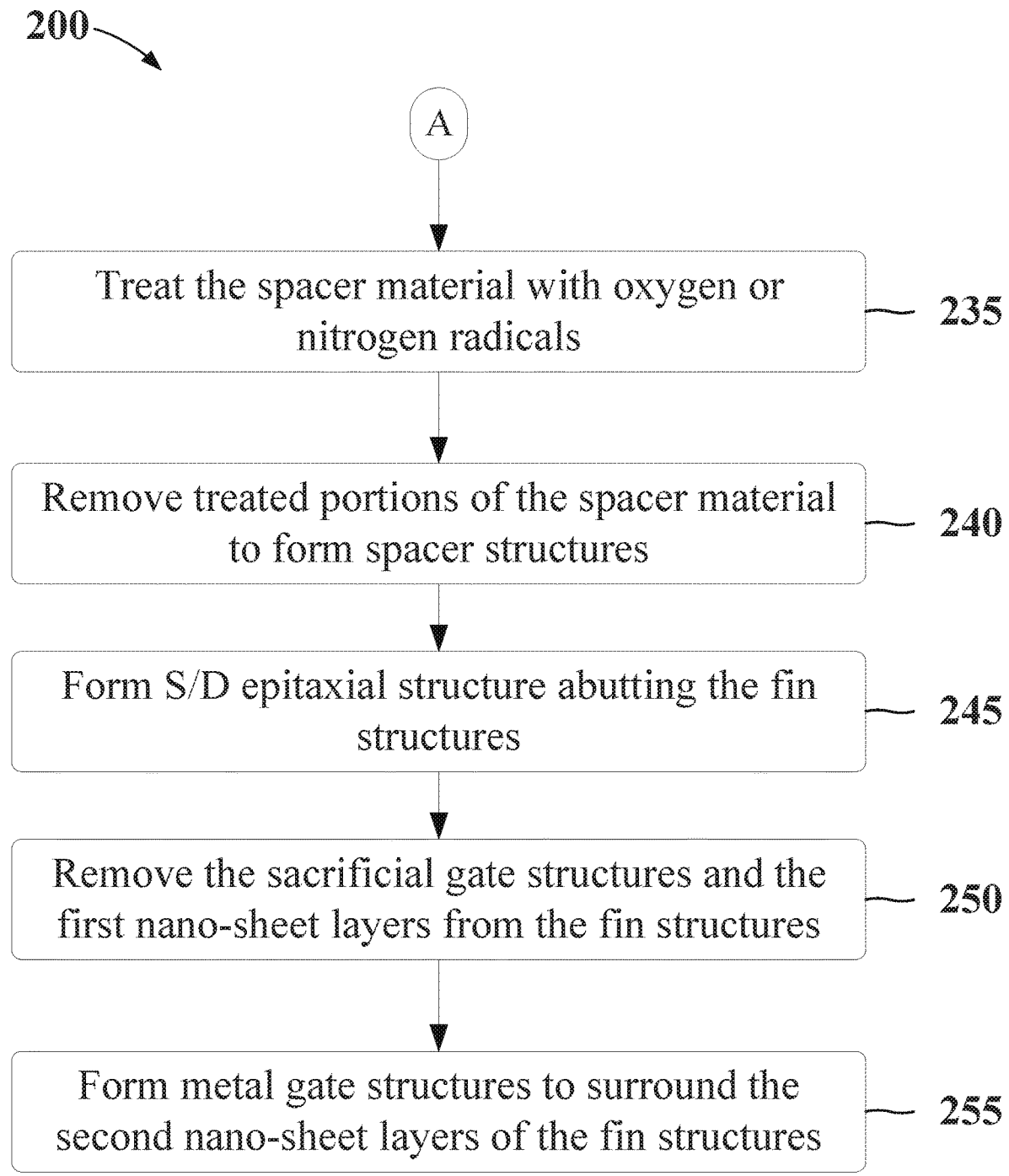

According to some embodiments, FIGS. 2A and 2B are flow charts of a fabrication method 200 for the formation of spacer structures 130 in GAA-FETs 100 and 105 shown in FIG. 1. Other fabrication operations can be performed between the various operations of method 200 and are omitted merely for clarity. This disclosure is not limited to this operational description and additional operations may be performed. Moreover, not all operations may be needed to perform the disclosure provided herein. Additionally, some of the operations may be performed simultaneously, or in a different order than the ones shown in FIGS. 2A and 2B. In some embodiments, one or more other operations may be performed in addition to or in place of the presently described operations. For illustrative purposes, method 200 is described with reference to the structures shown in FIGS. 3 through 16.

In referring to FIG. 2A, method 200 begins with operation 205 and the process of forming a stack of alternating first and second NS layers on a substrate (e.g., substrate 110). In sonic embodiments, the substrate (e.g., substrate 110) includes silicon or another elementary semiconductor, such as germanium (Ge). In some embodiments, the substrate includes a compound semiconductor like silicon carbide (SiC), gallium arsenide (GaAs), gallium phosphide (GaP), indium phosphide (InP), indium arsenide (InAs), or indium antimonide (InSb). In some embodiments, the substrate includes an alloy semiconductor, like silicon germanium (SiGe), gallium arsenide phosphide (GaAsP), aluminum indium arsenide (AlInAs), aluminum gallium arsenide (AlGaAs), gallium indium arsenide (GaInAs), gallium indium phosphide (GaInP), or gallium indium arsenide phosphide (GaInAsP). In some embodiments, the substrate includes any combination of the aforementioned materials. In some embodiments, substrate 110 is intrinsic (e.g., un-doped) or doped.

Figure 3:
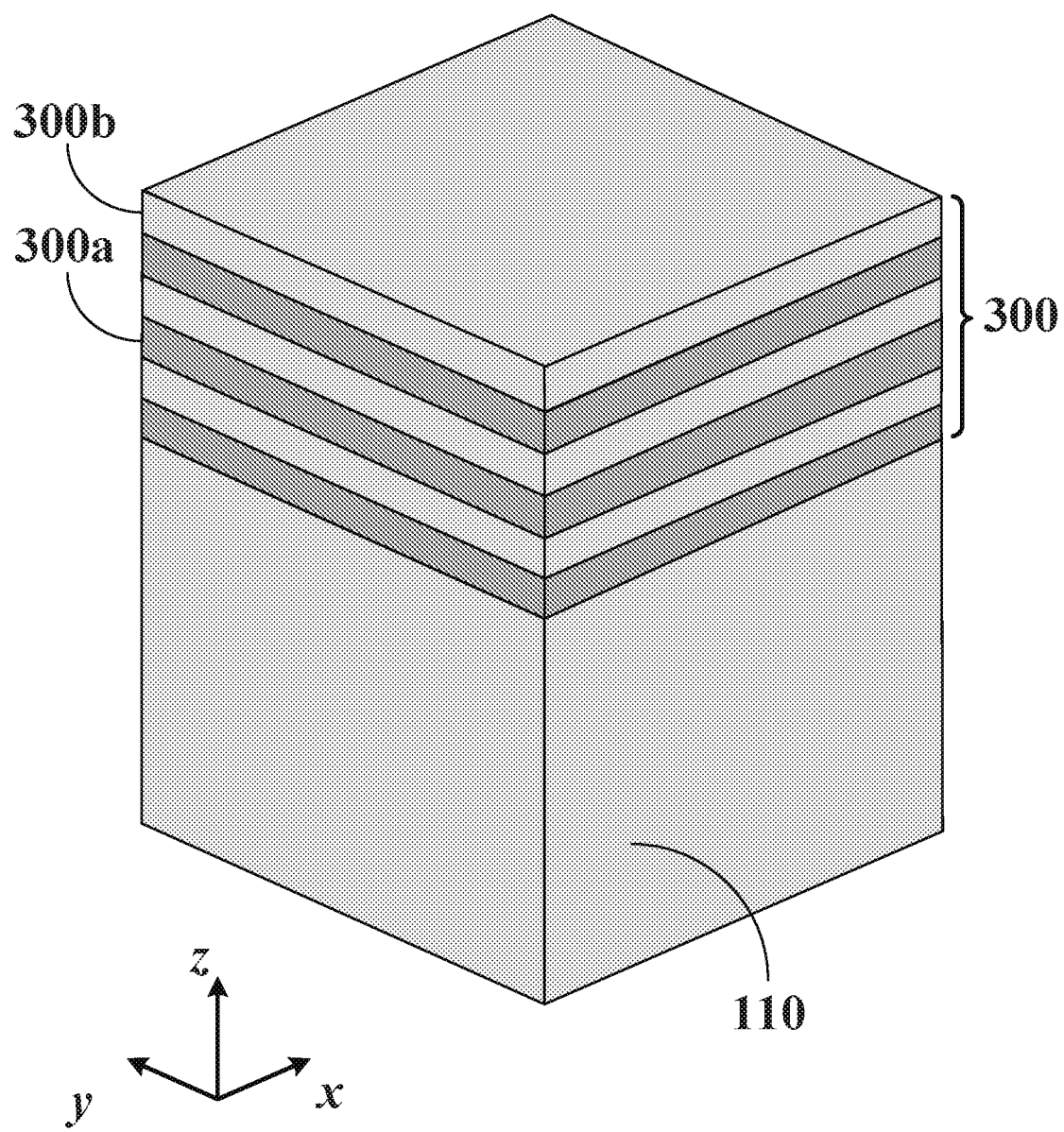
FIGS. 3 and 4 are isometric views of intermediate structures during the fabrication of spacer structures between gate structures and source/drain epitaxial structures of nanostructure transistors, in accordance with some embodiments.

In some embodiments, FIG. 3 is an isometric view of substrate 110 after operation 205 and the formation of a stack 300 of alternating first and second NS layers 300a and 300b. In some embodiments, first and second NS layers 300a and 300b are formed on exposed top surfaces of substrate 110. In some embodiments, first NS layers 300a are sacrificial NS layers subsequently removed and second NS layers 300b correspond to Si NS or NW layers 120 shown in FIG. 1. In some embodiments, the material of first NS layers 300a in stack 300 is selected so that first NS layers 300a can be selectively removed via etching from stack 300 without removing second NS layers 300b. For example, if second NS layers 300b are Si NS layers, second NS layers 300b can be SiGe NS layers. In some embodiments, the deposition sequence begins with the type of the NS layers to be removed—for example, in this case with first NS layer 300a.

First and second NS layers 300a and 300b can be grown with any suitable method. For example, first and second NS layers 300a and 300b can be grown with a CVD process with precursor gases, like silane ($SiH_4$), disilane ($Si_2H_6$), dichlorosilane ($SiH_2Cl_2$), germane ($GeH_4$), digermane ($Ge_2H_6$), other suitable gases, or combinations thereof. In some embodiments, first NS layers 300a include between about 20 at. % and about 30 at. % Ge, while second NS layers 300b are substantially germanium-free—e.g., have a Ge concentration less than about 1%. In some embodiments, second NS layers 300b, which correspond to Si NS or NW layers 120 in FIG. 1, form the channel region of GAA-FET 100 and can be lightly doped or intrinsic (e.g., un-doped). If lightly doped, the doping level of second NS layers 300b is less than about $10^{13}$ atoms/cm$^3$. First and second NS layers 300a and 300b can be sequentially deposited without a vacuum break (e.g., in-situ) to avoid the formation of any intervening layers. In some embodiments, first NS layers 300a can be doped to increase their etching selectivity compared to second NS layers 300b in a subsequent etching operation.

In some embodiments, the thickness of first NS layers 300a controls the spacing between every other second NS layer 300b in stack 300. The thickness of first and second NS layers 300a and 300b can range, for example, from about 3 nm to about 15 nm. Since first and second NS layers 300a and 300b are grown individually, the thickness of each NS layer can be adjusted independently based, for example, on the deposition time. In some embodiments, additional or fewer number of first and second NS layers 300a and 300b can be formed in stack 300. In some embodiments, the total number of NS layers is 2n where n is the number of first NS layers 300a or the number of second NS layers 300b in stack 300.

In referring to FIG. 2A, method 200 continues with operation 210 and the process of patterning stack 300 to form fin structures. In some embodiments, stack 300 is patterned to form fin structures with a width along the y-direction and a length along the x-direction. The fin structures can be formed by patterning with any suitable method. For example, the fin structures may be patterned using one or more photolithography processes, including double-patterning or multi-patterning processes. Double-patterning or multi-patterning processes can combine photolithography and self-aligned processes, allowing patterns to be created that have, for example, pitches smaller than what is otherwise obtainable using a single, direct photolithography process. For example, in some embodiments, a sacrificial layer is formed over stack 300 and patterned using a photolithography process. Spacers are formed alongside the patterned sacrificial layer using a self-aligned process. The sacrificial layer is then removed, and the remaining spacers may then be used as masking structures to pattern the fin structures.

Figure 4:
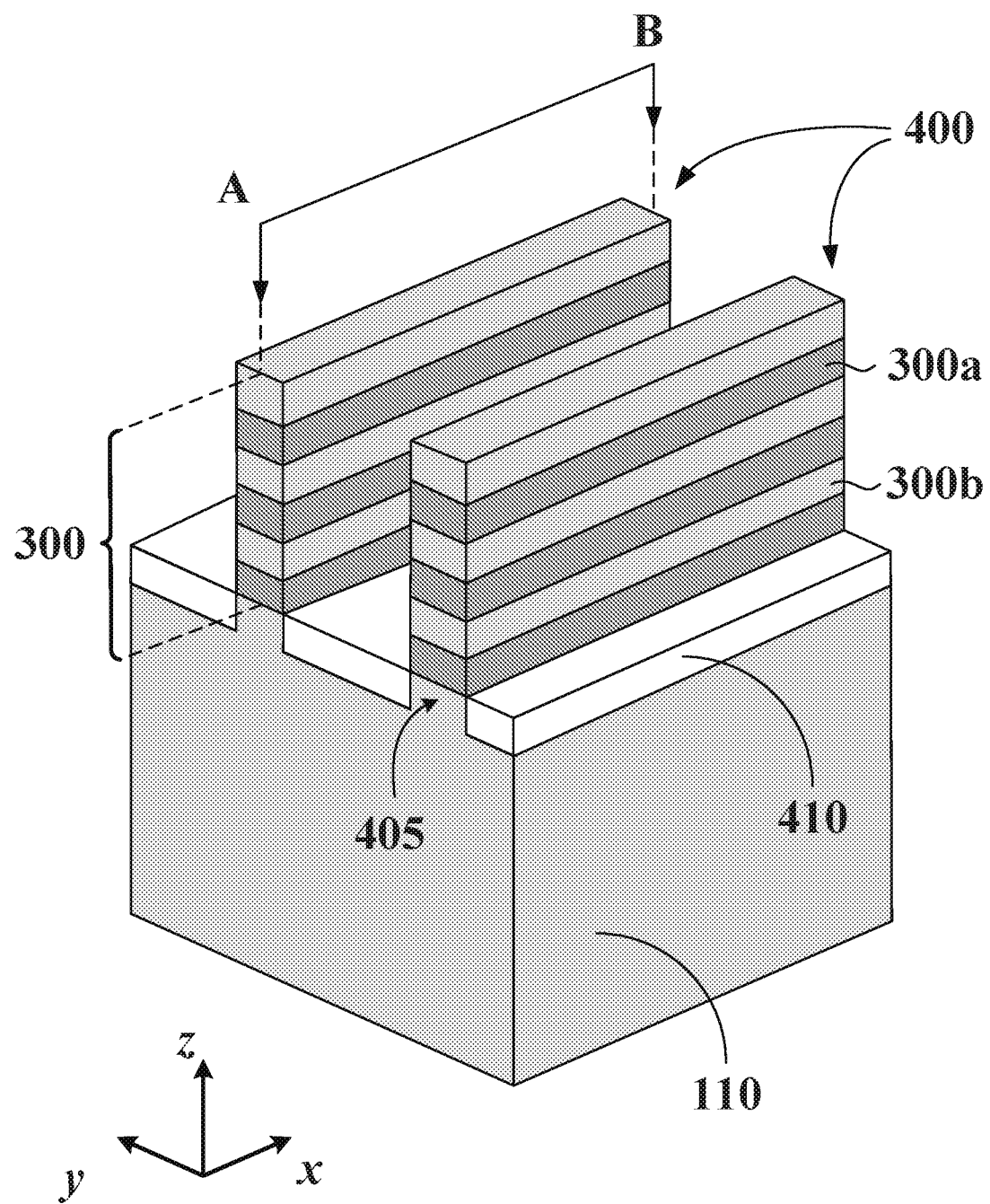

By way of example and not limitation, FIG. 4 is an isometric view of fin structures 400 formed from stack 300 with the aforementioned patterning process. In some embodiments, the aforementioned patterning process does not terminate on the top surface of substrate 110 but continues to etch a top portion substrate 110 to form a pedestal structure 405 from substrate 110 under each fin structure 400. In some embodiments, this is intentional to facilitate the formation of an isolation structure and the S/D epitaxial structures described below. Since fin structures 400 and pedestal structures 405 are formed with the same patterning process, fin structures 400 and pedestal structures 405 are substantially aligned to each other. For example, sidewall surfaces of fin structures 400 in the x-z plane and y-z plane are substantially aligned to respective sidewall surfaces of pedestal structures 405 as shown in FIG. 4.

Additional fin structures, like fin structures 400, can be formed on substrate 110 in the same or different area of substrate 110. These additional fin structures are not shown in FIG. 4 for simplicity. By way of example and not limitation, each fin structure 400 has a width along the y-direction between about 15 nm and about 150 nm.

In some embodiments, layers 300a and 300b are referred to as "nano-sheets" when their width along the y-direction is substantially different from their height along z-direction—for example, when their width is larger/narrower than their height. In some embodiments, layers 300a and 300b are referred to as "nano-wires" when their width along the y-direction is equal to their height along z-direction. In some embodiments, layers 300a and 300b are deposited as nano-sheets and subsequently patterned to form nano-wires with equal height and width. By way of example and not limitation, layers 300a and 300b will be described in the context of nano-sheets (NS) layers. Based on the disclosure herein, nano-wires (NW), as discussed above, are within the spirit and the scope of this disclosure. Further, for example purposes and without limiting the scope of this disclosure, first and second NS layers 300a and 300b in method 200 will be described in the context of Si and SiGe NS layers respectively.

In some embodiments, after the formation of fin structures 400, an isolation structure 410 is formed on etched or recessed portions of substrate 110 to cover sidewall surfaces of pedestal structures 405. In some embodiments, isolation structure 410 is a shallow trench isolation (STI) structure that electrically isolates fin structures 400 and includes one or more silicon oxide based dielectrics. By way of example and not limitation, isolation structure 410 can be formed as follows. An isolation structure material (e.g., a silicon oxide based dielectric) is blanket deposited over fin structures 400 and substrate 110. The as-deposited isolation structure material is planarized (e.g., with a chemical mechanical polishing (CMP) process) so that the top surface of the isolation structure material is substantially coplanar with the top surface of fin structures 400. The planarized isolation structure material is subsequently etched-back so that the resulting isolation structure 410 has a height substantially similar to pedestal structure 405, as shown in FIG. 4. In some embodiments, stack 300 protrudes from isolation structure 410 so that isolation structure 410 does not cover any sidewall portion of stack 300 as shown in FIG. 4. This is intentional and facilitates the formation of GAA-FETs 100 and 105 shown in FIG. 1.

Figure 5:
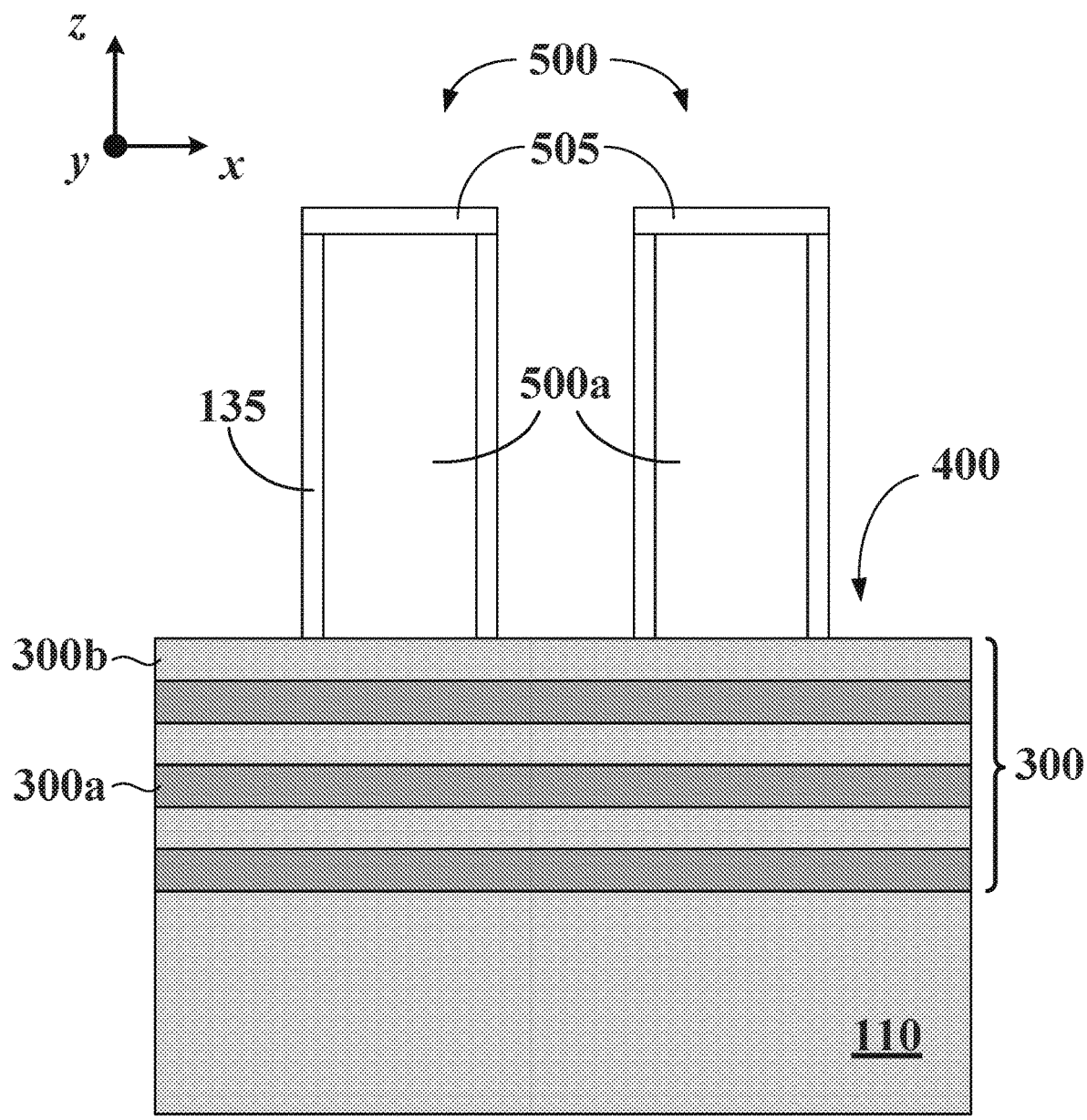
FIGS. 5 through 8 are cross-sectional views of intermediate structures during the fabrication of spacer structures between gate structures and source/drain epitaxial structures of nanostructure transistors, in accordance with some embodiments.

In referring to FIG. 2A, method 200 continues with operation 215 and the process of forming sacrificial gate structures on fin structures 400. In some embodiments, the sacrificial gate structures are formed with their length along the y-direction—e.g., perpendicular to fin structures 400 shown in the isometric view of FIG. 4—and their width along the x-direction. By way of example and not limitation, FIG. 5 is a cross-sectional view of FIG. 4 along cut-line AB. FIG. 5 shows sacrificial gate structures 500 formed on portions of fin structures 400. Because FIG. 5 is a cross-sectional view, as opposed to an isometric view, portions of sacrificial gate structures 500 covering sidewall portions of fin structures 400 are not shown. Further, in the cross-sectional view of FIG. 5, only one of fin structures 400 from FIG. 4 is shown. In some embodiments, portions of gate structures 500 are formed between fin structures 400 and on isolation structure 410 shown in FIG. 4.

In some embodiments, sacrificial gate structures 500 cover top and sidewall portions of fin structures 400. In some embodiments, sacrificial gate structures 500 are replaced by gate structures 115 shown in FIG. 1 during a gate replacement process. Sacrificial gate structures 500 include a sacrificial gate electrode 500a formed on a sacrificial gate dielectric not shown in FIG. 5 for simplicity. At this fabrication stage, gate spacers 135 and capping layers 505 are formed on sidewall and top surfaces of sacrificial gate structures 500. As discussed above, gate spacers 135 are not removed during the gate replacement process; instead, gate spacers 135 facilitate the formation of gate structures 115. Capping layers 505 protect sacrificial gate electrode 500a from subsequent etching operations discussed below.

By way of example and not limitation, sacrificial gate structures 500 are formed by depositing and patterning the sacrificial gate dielectric and gate electrode layers over fin structures 400. Gate spacers 135 and capping layer 505 are formed once sacrificial gate structures 500 are formed. In some embodiments, sacrificial gate structures 500 are formed over multiple fin structures 400. As shown in FIG. 5, edge portions of fin structures 400 are not covered by sacrificial gate structures 500. This is because the width of sacrificial gate structures 500 is narrower than the length of fin structures 400 along the x-direction. In some embodiments, sacrificial gate structures 500 are used as masking structures in subsequent etching operations to define the channel region of GAA-FETs 100 and 105 shown in FIG. 1. For this reason, the lateral dimensions (e.g., the width and length) of sacrificial gate structures 500 and gate structures 115 are substantially similar.

Figure 6:
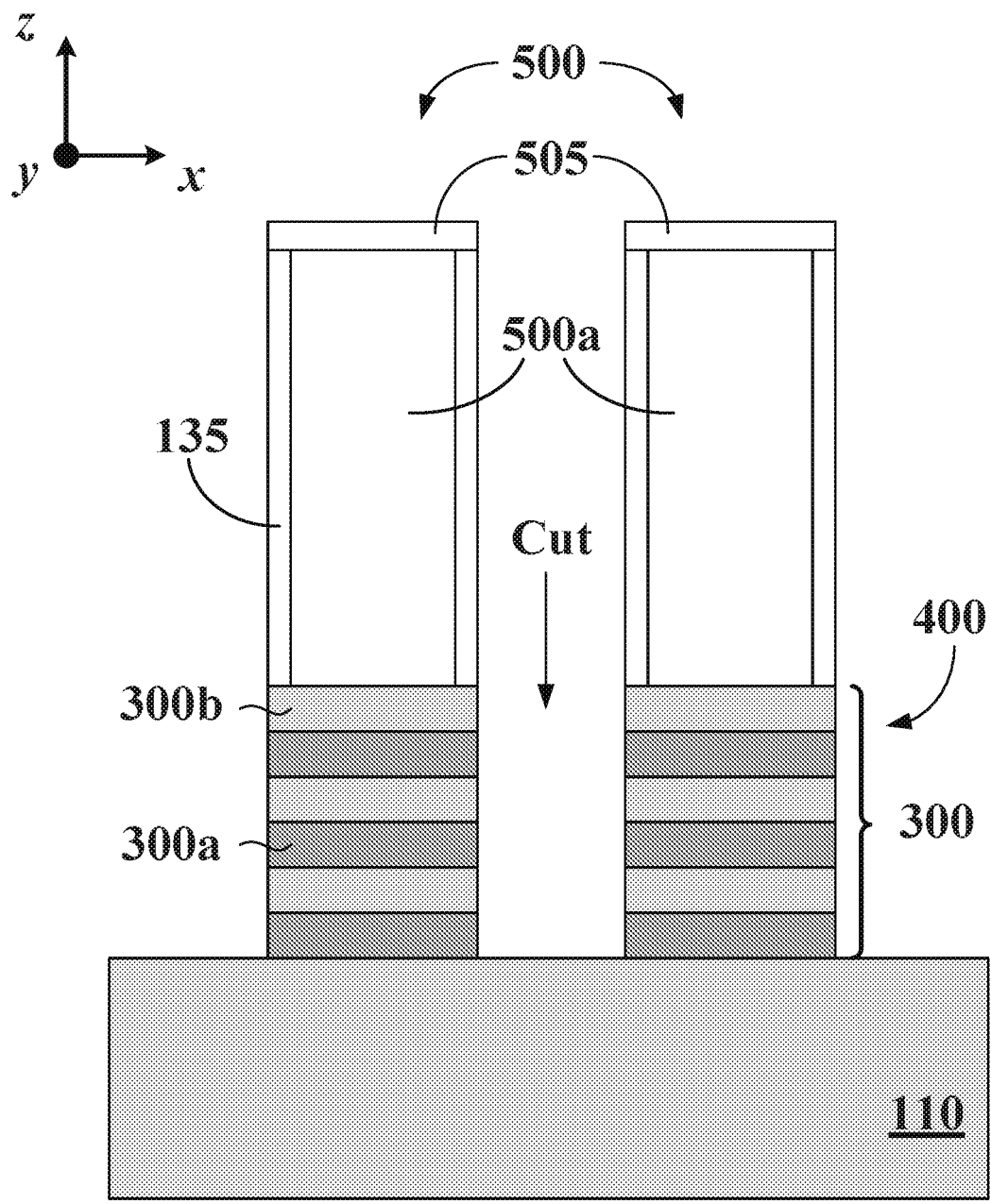

In referring to FIG. 2A, method 200 continues with operation 220 and the process of removing (e.g., "trimming") portions of fin structures 400 not covered by sacrificial gate structures 500. As discussed above, the edge portions of fin structures 400 are not covered by sacrificial gate structures 500 and are therefore removed in operation 220. In some embodiments, FIG. 6 shows the structure of FIG. 5 after operation 220. In some embodiments, the removal process involves a dry etching process, a wet etching process, or combinations thereof The removal process is selective towards second NS layers 300b and first NS layers 300a (e.g., Si and SiGe). In sonic embodiments, the dry etching process includes etchants having an oxygen-containing gas, a fluorine-containing gas (e.g., carbon tetrafluoride ($CF_4$), sulfur hexafluoride ($SF_6$), difluoromethane ($CH_2F_2$), trifluoromethane ($CHF_3$), and/or hexafluoroethane ($C_2F_6$)); a chlorine-containing gas (e.g., chlorine ($Cl_2$), chloroform ($CHCl_3$), carbon tetrachloride ($CCl_4$), and/or boron trichloride ($BCl_3$)); a bromine-containing gas (e.g., hydrogen bromide (HBr) and/or bromoform ($CHBr_3$)); an iodine-containing gas; other suitable etching gases and/or plasmas; or combinations thereof. The wet etching chemistry can include diluted hydrofluoric acid (DHF), potassium hydroxide (KOH) solution, ammonia; a solution containing hydrofluoric acid (HF), nitric acid ($HNO_3$), acetic acid ($CH_3COOH$); or combinations thereof.

In some embodiments, the etchants of the aforementioned etching process do not substantially etch sacrificial gate structures 500—which is protected by capping layers 505 and gate spacers 135—and isolation structure 410 shown in FIG. 4. This is because capping layers 505, gate spacers 135, and isolation structure 410 include materials with a low etching selectivity, such as a silicon nitride based material (e.g., silicon nitride, silicon carbon nitride, silicon carbon oxy-nitride, etc.) or silicon oxide based materials. In some embodiments, isolation structure 410 shown in FIG. 4 is used as an etch stop layer for the etching process described above.

Because of operation 220, a "cut" is formed in each fin structure 400 as shown in FIG. 6. The cut divides each fin structure 400 into two separate portions with each portion covered by a sacrificial gate structure 500.

Figure 7:
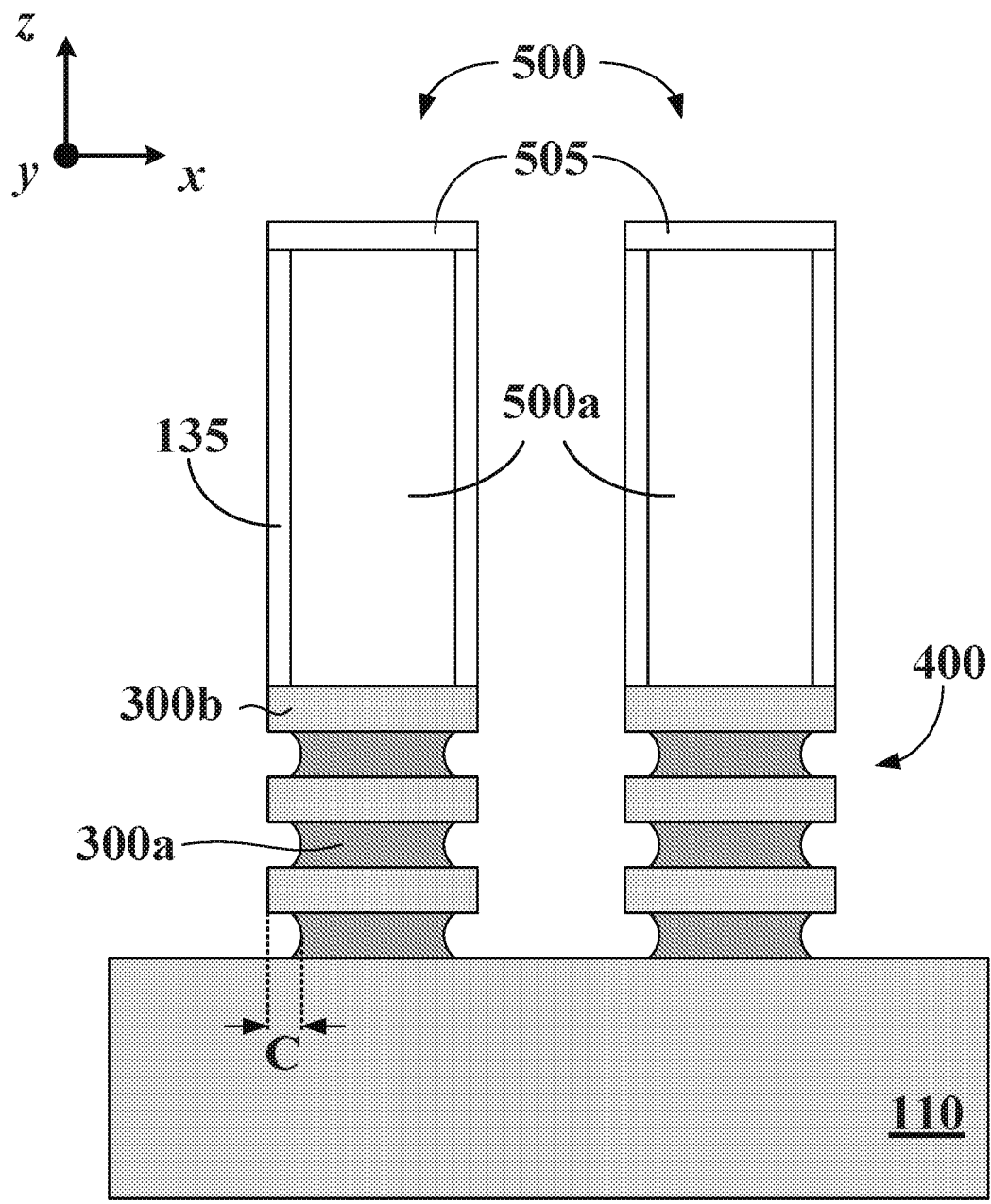

In referring to FIG. 2A, method 200 continues with operation 225 and the process of selectively etching edge portions first NS layers 300a from fin structures 400. According to some embodiments, FIG. 7 shows the structure of FIG. 6 after operation 225 where exposed edges of first NS layers 300a are laterally etched (e.g., recessed) along the x-direction. According to some embodiments, exposed edges of first NS layers 300a are recessed (e.g., partially etched) by an amount C that ranges from about 3 nm to about 10 nm along the x-direction as shown in FIG. 7. In some embodiments, spacer structures 130 shown in FIG. 1 will be formed in the recessed portions of first NS layers 300a. These recessed portions of first NS layers 300a are referred to herein as "spacer cavities" having a width C along the x-direction. According to some embodiments, spacer cavities with a width less than about 10 nm result in spacer structures 130 that are too thin to provide adequate electrical isolation between gate structures 115 and S/D epitaxial structures 125 shown in FIG. 1. On the other hand, spacer cavities with a width C greater than about 50 nm result in spacer structures 130 that reduce the gate length of the resulting transistor structures (e.g., GAA FETs 100 and 105).

In some embodiments, the recess in first NS layers 300a can be achieved with a dry etching process selective towards SiGe. For example, halogen-based chemistries exhibit a high etching selectivity towards Ge and a low etching selectivity towards Si. Therefore, halogen gases etch Ge-containing layers, such as first NS layers 300a, at a higher etching rate than substantially Ge-free layers like second NS layers 300b. In some embodiments, the halogen-based chemistries include fluorine-based and/or chlorine-based gasses. Alternatively, a wet etching chemistry with high selectivity towards SiGe can be used. By way of example and not limitation, a wet etching chemistry may include a mixture of sulfuric acid ($H_2SO_4$) and hydrogen peroxide ($H_2O_2$) (SPM), or a mixture of ammonia hydroxide with $H_2O_2$ and water (APM). The aforementioned etching processes are timed so that the desired amount of SiGe is removed.

In some embodiments, first NS layers 300a with a higher Ge atomic concentration have a higher etching rate than first NS layers 300a with a lower Ge atomic concentration. Therefore, the etching rate of the aforementioned etching processes can be adjusted by modulating the Ge atomic concentration (e.g., the Ge content) in first NS layers 300a. As discussed above, the Ge content in first NS layers 300a can range between about 20% and about 30%. A SiGe nano-sheet layer with about 20% Ge can be etched slower than a SiGe nano-sheet layer with about 30% Ge. Consequently, the Ge concentration can be adjusted accordingly to achieve the desired etching rate and selectivity between first NS layers 300a and second NS layers 300b.

In some embodiments, a Ge concentration below about 20% does not provide adequate selectivity between first NS layers 300a and second NS layers 300b. For example, the etching rate between first NS layers 300a and second NS layers 300b becomes substantially similar to one another and both types of nano-sheet layers can be etched during the etching process. On the other hand, for Ge concentrations higher than about 30%, Ge atoms can out-diffuse from first NS layers 300a towards second NS layers 300b (e.g., during growth) and change the selectivity between first NS layers 300a and second NS layers 300b during etching. Since Ge out-diffusion cannot be controlled, Ge concentrations higher than about 30% can result in unpredictable etching amounts. In some embodiments, first NS layers 300a are doped during deposition to tune the etching selectivity further.

Figure 8:
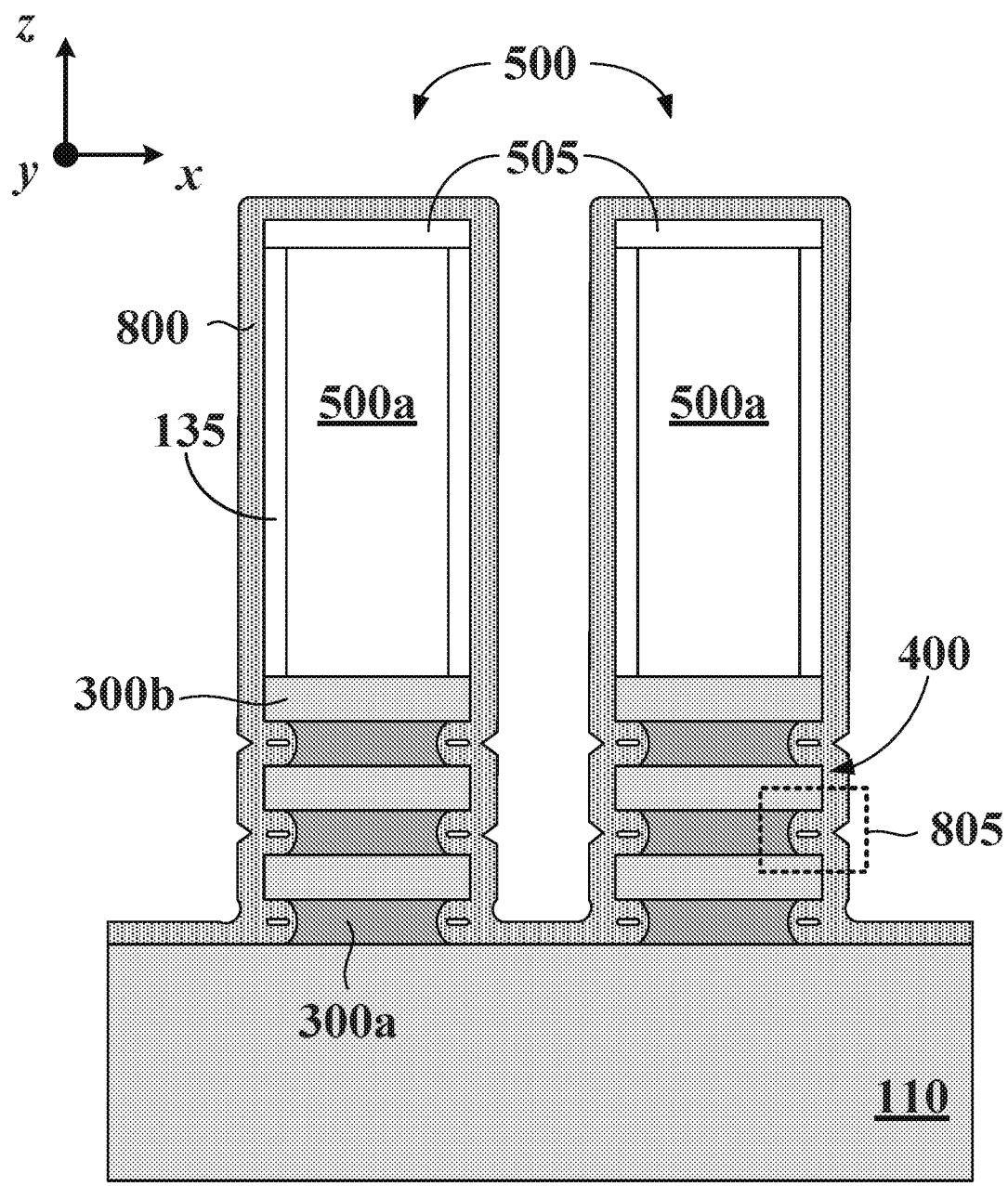

In referring to FIG. 2A, method 200 continues with operation 230 and the process of depositing a spacer material over fin structure 400. In some embodiments and in referring to FIG. 8, a spacer layer 800 can be blanket deposited over the entire structure of FIG. 7 as shown in FIG. 8. For example, spacer layer 800 is deposited on the exposed surfaces of substrate 110, fin structure 400, gate spacers 135, and capping layer 705. In some embodiments, spacer layer 800 is deposited at a thickness between about 2 nm and about 7 nm to cover edge portions of fin structure 400 as shown in FIG. 8. In some embodiments, spacer layer 800 includes a silicon-based dielectric, such as silicon nitride (SiN), silicon oxy-carbon-nitride (SiOCN), silicon carbon-nitride (SiCN), or silicon oxy-nitride (SiON). In some embodiments, spacer layer 800 is a low-k material, such as a porous material and a carbon-rich silicon oxide based dielectrics. For example, spacer layer 800 can include organosilicates with methyl ($CH_3$), methylene ($CH_2$), or hydrogen (H) terminal groups; boron nitride (BN); SiCOH, SiCH, SiOH, SiBN, SiOBN, SiCBN, fluorine doped low-k dielectrics, polyimides, amorphous carbon (a-C), parylene, or other suitable dielectric materials. In some embodiments, spacer layer 800 can be deposited with a plasma-enhanced atomic layer deposition (PEALD) process or another suitable deposition method capable of depositing conformal layers. As shown in FIG. 8, spacer layer 800 fills the spacer cavity formed by neighboring second NS layers 300b and the recessed edge portions of first NS layers 300a. Because of the spacer layer deposition, sidewall surfaces of fin structure 400 are no longer exposed.

Figure 9:
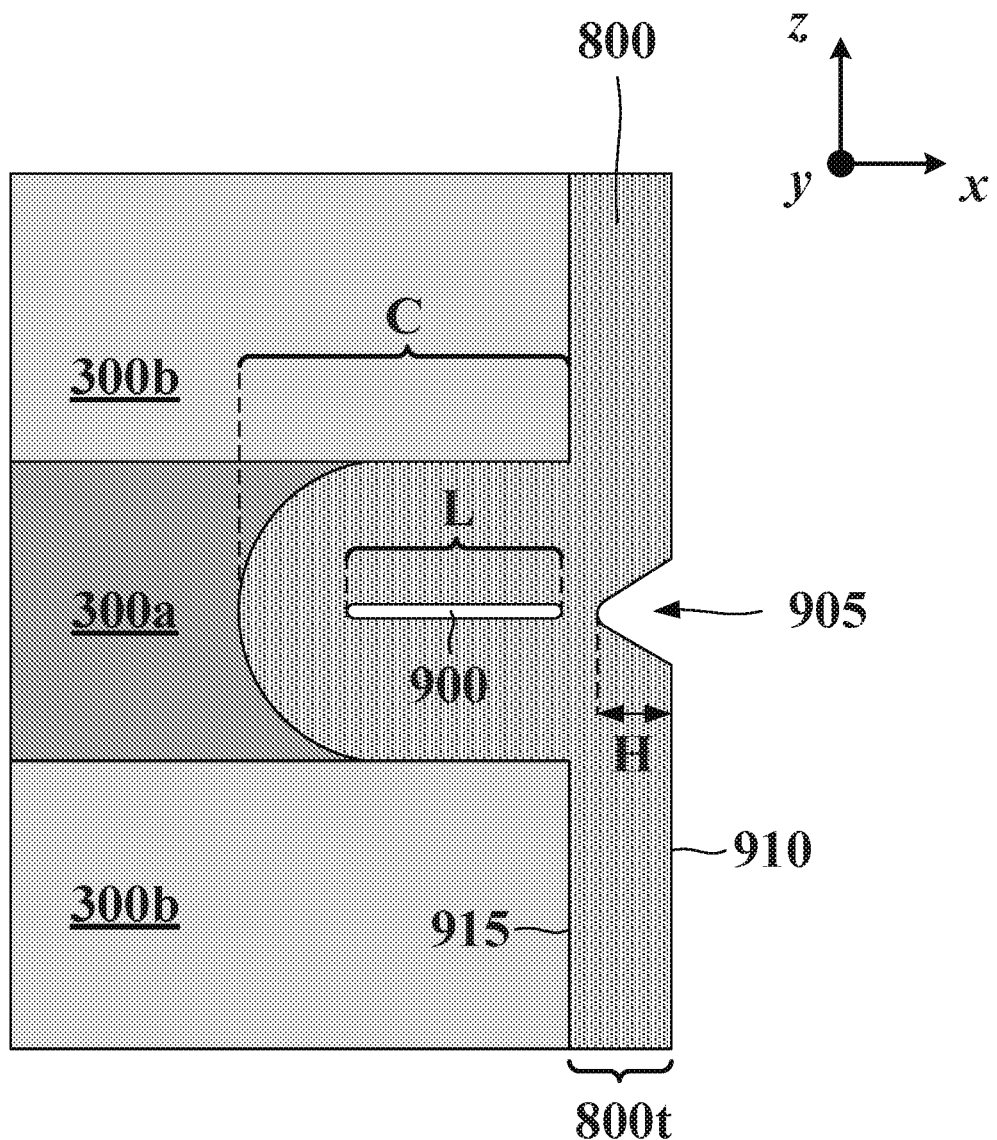
FIGS. 9 through 11 are magnified cross-sectional views of intermediate structures during the fabrication of spacer structures between gate structures and source/drain epitaxial structures of nanostructure transistors, in accordance with some embodiments.
Figure 10:
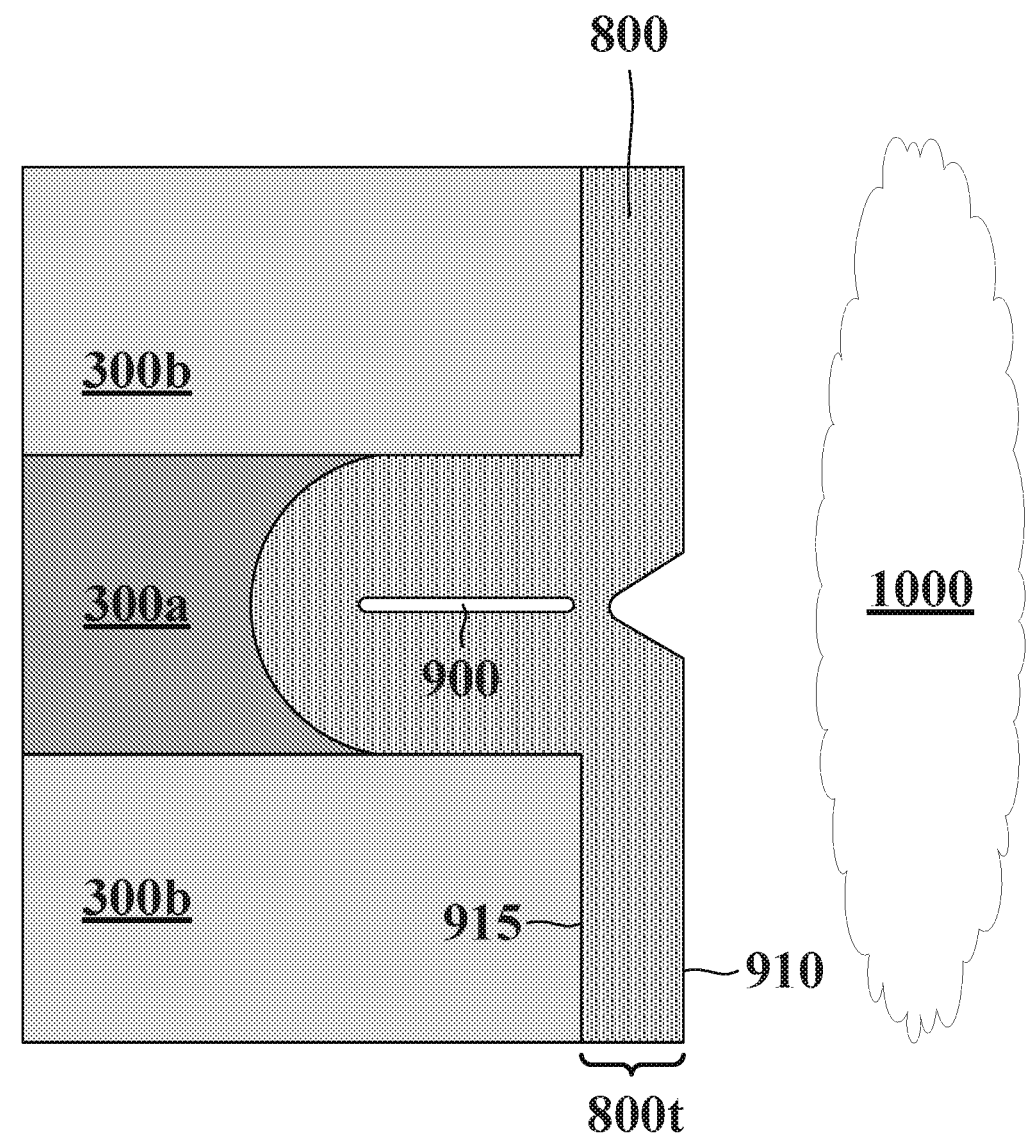

According to some embodiments, FIG. 9 is a magnified view of area 805 shown in FIG. 8. According to some embodiments, due to the geometry of the spacer cavity and to the limitations related to the deposition process of spacer layer 800, spacer layer 800 may not completely fill the spacer cavity. Instead, a seam or a "keyhole" 900 may form in the spacer cavity as shown in FIG. 9, In some embodiments, seam 900 has a width between about 0.3 nm and about 1 nm along the z-direction, and a length L less than about length C of the spacer cavity in the x-direction (e.g., 3 nm<L<10 nm). In some embodiments, a dimension of seam 900 along the y-direction can be less than a respective dimension of the spacer cavity. In some embodiments, seam 900 can be a desirable feature if it is not exposed during a subsequent etching. For example, seam 900 reduces the dielectric constant (k value) of spacer layer 800 and the parasitic capacitance formed between gate structures 115 and S/D epitaxial layers 125 in CAA FM's 100 and 105 shown in FIG. 1. In addition to the above, the surface topography of spacer layer 800 is not planar over the spacer cavity but forms a "notch" 905, which can be enlarged to expose seam 900 if the subsequent etching process of spacer layer 800 is poorly controlled. In some embodiments, notch 905 has a dimension H along the x-direction, which is less than thickness 800t of spacer layer 800 (e.g., 2 nm and about 7 nm) over second NS layer 300b (e.g., H<800t). In some embodiments, dimension H ranges between about 2 nm and about 5 nm. In some embodiments, ratio 800t/H can be between greater than about 1 and less than or equal to about 3.5 (e.g., 1<800t/H≤3.5).

In some embodiments, the etching process of spacer layer 800 for the formation of the spacer structures includes an oxidation operation that oxidizes portions of spacer layer 800 to be removed in the etching process. The remaining or un-etched portions of spacer layer 800 form spacer structures 130 shown in FIG. 1. In some embodiments, the etching rate of spacer layer 800 increases as the oxygen concentration in spacer layer 800 increases. Consequently, the oxygen concentration in spacer layer 800 can be used to control the etching rate of spacer layer 800. For example, if the highest oxygen concentration is located at top surfaces 910 (outer surfaces 910) of spacer layer 800 and gradually decreases towards bottom surfaces 915 (inner surfaces 915), the etching rate for spacer layer 800 will "follow" the oxygen concentration and be higher for outer surfaces 910 and lower for inner surfaces 915. Therefore, the etching selectivity for spacer layer 800 can be modulated through the oxygen concentration profile across thickness 800t of spacer layer 800.

In some embodiments, the oxidation process can be replaced with an equivalent nitridation process, which incorporates nitrogen into spacer layer 800 instead of oxygen. According to some embodiments, the etching rate of spacer layer 800 increases and decreases with the nitrogen concentration in spacer layer 800 in a similar manner as discussed above with respect to the oxygen concentration in spacer layer 800.

In referring to FIG. 2B, method 200 continues with operation 235 and the process of treating the spacer material (e.g., spacer layer 800) with oxygen or nitrogen radicals (O* or N*). In some embodiments, O* or N* are generated with a microwave plasma 1000 shown in FIG. 10 having a frequency of about 2.45 GHz. In some embodiments, the advantages of microwave plasma 1000—for example, as opposed to a radio frequency (RF) inductively-coupled-plasma (ICP) with a frequency of about 13.56 MHz—include: (i) a high density of electrons in the plasma (e.g., about $10^{12}$ electrons/$cm^3$); (ii) low plasma damage for the spacer material due to the absence of ions; (iii) a wide operating pressure range (e.g., between about 1 and about 5 Torr); (iv) treatment uniformity; and (v) a low operating temperature (e.g., less than about 400° C.). In some embodiments, free radicals, like O* and N*, are more reactive than ions and therefore have a shorter lifetime. In some embodiments, the above operating conditions produce a free radical density capable of sustaining a high degree of reactivity and efficiency.

For example purposes, method 200 will be described in the context of an oxygen treatment with oxygen radicals (O*). Based on the disclosure herein, a treatment with nitrogen radicals (N*), as discussed above, can be used. The treatment with N* is within the spirit and scope of this disclosure.

Figure 11:
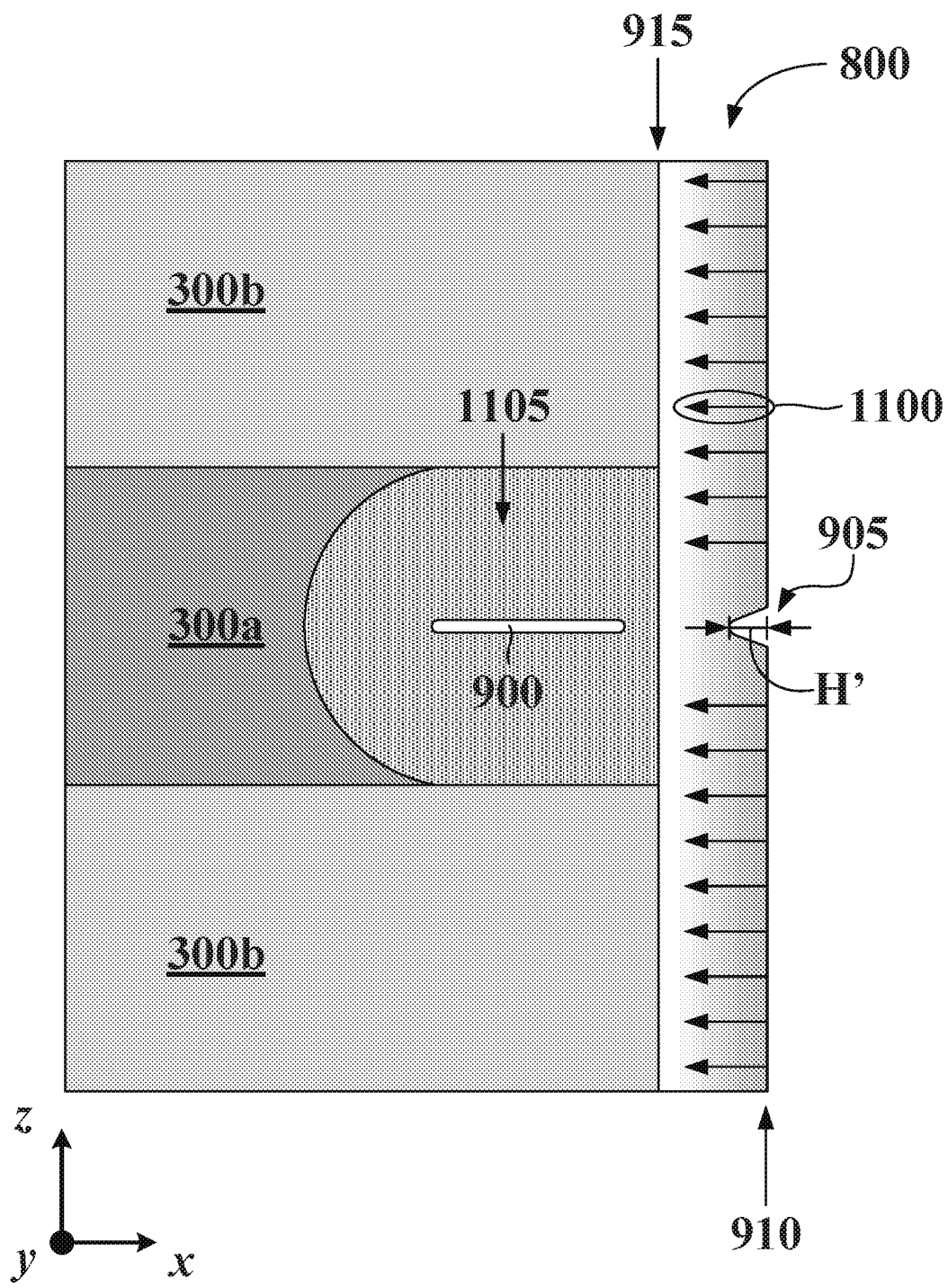

In some embodiments, and in referring to FIG. 11, the treatment with O* or N* introduces oxygen or nitrogen into spacer layer 800 and forms an oxygen or nitrogen atomic concentration gradient starting from outer surfaces 910 of spacer layer 800 and extending towards inner surfaces of spacer layer 800 as indicated by arrows 1100. In some embodiments, the oxygen or nitrogen gradient has a thickness between about 1 nm and about 2 nm, or more, based on the thickness of spacer layer 800 to be removed.

Figure 12A:
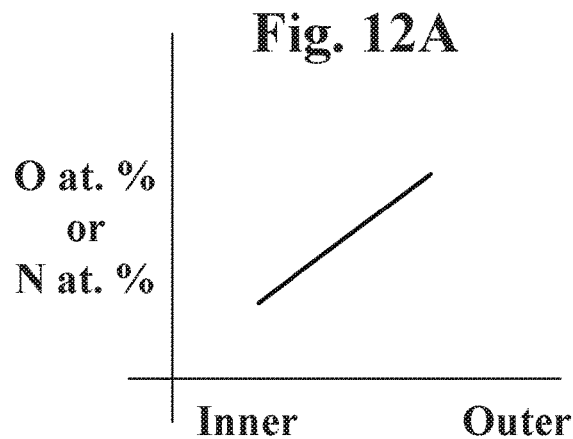
FIGS. 12A and 12B are oxygen or nitrogen concentration profiles in treated spacer layers, in accordance with some embodiments.
Figure 12B:
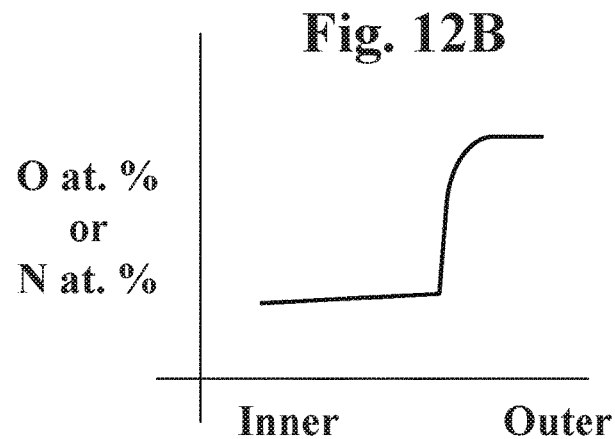

In some embodiments, the oxygen free radicals (O*) are produced from a gas mixture of oxygen and hydrogen. In some embodiments, the oxygen atomic concentration profile ("oxygen profile") achieved within spacer layer 800 is processing pressure dependent. For example, a high to medium processing pressure—with a high processing pressure being between about 3 Torr and about 5 Torr, and a medium processing pressure being between about 2 Torr and about 3 Torr—a linear oxygen profile can be achieved as shown in FIG. 12A. On the other hand, a low processing pressure between about 1 Torr and about 2 Torr results in a "step-function" oxygen profile with a steeper transition as shown in FIG. 12B. In some embodiments, and in referring to FIGS. 12A and 12B, the peak oxygen atomic concentration at outer surfaces 910 of spacer layer 800 is between about 50% and about 60%, and the lowest oxygen atomic concentration at inner surfaces 910 is between about 10% and about 20%. For example, the oxygen concentration on outer surfaces 910 can be 2.5 to 6 times higher than that on inner surfaces 910. In some embodiments, the oxygen atomic concentration of spacer layer 800 within the spacer cavity (e.g., at location 1105) is not affected by the O* treatment and its oxygen concentration remains substantially unchanged.

In some embodiments, high processing pressures (e.g., between about 3 Torr and about 5 Torr) favor plasma oxygen species with the "triplet" oxygen electronic configuration or ground state $O(^3P_2)$. In contrast, low processing pressures (e.g., between about 1 Torr and about 2 Torr) favor plasma oxygen species with the "singlet" oxygen electronic configuration or excited state $O(^1D_2)$. The excited $O(^1D_2)$ state is more chemically active than the ground state $O(^3P_2)$ and consequently the excited $O(^1D_2)$ can introduce more oxygen into spacer layer 800. Therefore, by transitioning from a high processing pressure to a low processing pressure, the treatment shifts from an $O(^3P_2)$ dominant plasma to an $O(^1D_2)$ dominant plasma and the other way around.

According to some embodiments, a strong $O(^1D_2)$ dominant plasma (e.g., at processing pressures less than 1 Torr) can impact the treatment uniformity, while a strong $O(^3P_2)$ dominant plasma (e.g., at process pressures greater than about 5 Torr) introduces limited amounts of oxygen in spacer layer 800 due to its lower chemical reactivity. However, due to their reduced reactivity, the ground state $O(^3P_2)$ species can penetrate deeper into spacer layer 800, as compared to the excited $O(^1D_2)$ species, and improve the treatment conformality. Meanwhile, a strong $O(^1D_2)$ dominant plasma (e.g., at processing pressures less than 1 Torr) will result in a relative shallow treatment depth, which may not be appropriate for a uniform treatment. Therefore, a balance between the ground state $O(^3P_2)$ species produced at higher pressure range and the excited $O(^1D_2)$ species produced at a lower pressure range can be used to achieve the desired treatment uniformity.

In some embodiments, the addition of hydrogen in an $O(^3P_2)$ dominant plasma enhances the oxidation rate and improves the etching selectivity by assisting the reconstruction of the silicon-oxygen bonds. In some embodiments, helium (He) can be added to the plasma to remove impurities from the treated spacer layer 800 and to enhance the oxidation rate of the treatment. In some embodiments, the removed impurities include, but are not limited to, carbon and nitrogen.

In some embodiments, since the chemical reactivity of free radicals is greater than that of atoms or molecules, the treatment process can occur at a lower temperature than that of a steam anneal. For example, the treatment process with O* or N* can occur at a temperature less than about 400° C. (e.g., ≤400° C.). Meanwhile, a steam anneal occurs at a temperature between about 450° C. and about 700° C., which significantly increases the processing thermal budget and can lead to undesirable oxidation of first and second NS layers 300a and 300b.

Figure 12C:
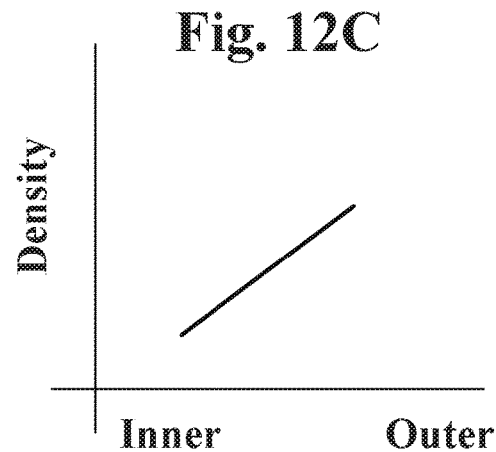
FIGS. 12C and 12D are density profiles of treated spacer layers, in accordance with some embodiments.
Figure 12D:
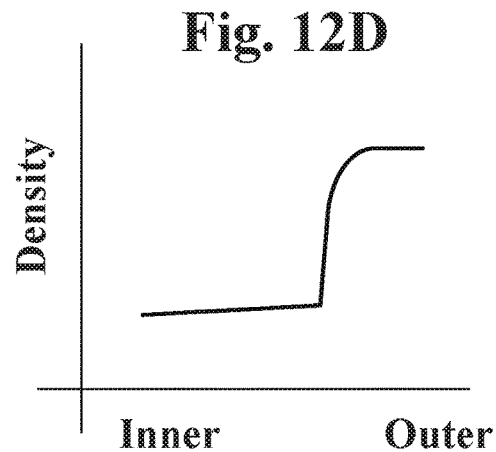
Figure 12E:
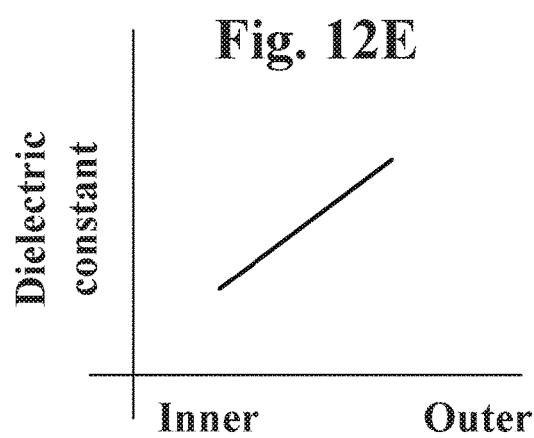
FIGS. 12E and 12F are dielectric constant profiles of treated spacer layers, in accordance with some embodiments.
Figure 12F:
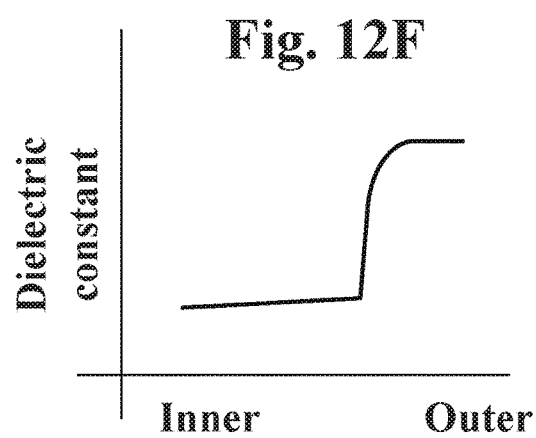

In some embodiments, due to the incorporation of oxygen in spacer layer 800, the density and the dielectric constant (k-value) of oxidized portions of spacer layer 800 (e.g., between outer surface 910 and inner surface 915 shown in FIG. 11) are altered compared to the non-oxidized portions of spacer layer 800 within the spacer cavity. For example, FIGS. 12C and 12E show, respectively, the density and dielectric constant profiles of oxidized portions of spacer layer 800 (e.g., between outer surface 910 and inner surface 915 shown in FIG. 11) having the oxygen profile of FIG. 12A. Similarly, FIGS. 12D and 12F show the density and dielectric constant profiles of oxidized portions of spacer layer 800 (e.g., between outer surface 910 and inner surface 915 shown in FIG. 11) having the step-function oxygen profile of FIG. 12B. In some embodiments, the x-axes in FIGS. 12A-F are common and represent the thickness of the oxidized portions of spacer layer 800 between outer surfaces 910 and inner surfaces 915 shown in FIG. 11 (e.g., across thickness 800t shown in FIG. 10). According to some embodiments, the density and dielectric constant profiles trend similarly to their respective oxygen profiles. This means that the oxygen profile is the main driver behind the density and k-values of the oxidized portions of spacer layer 800. In some embodiments, higher oxygen concentrations towards outer surfaces 910 result in higher density and dielectric constant values compared to lower oxygen concentrations towards inner surfaces 915. In some embodiments, the density values in the profiles shown in FIGS. 12C and 12D range between about 0.6 atoms/cm$^3$ and about 2.5 atoms/cm$^3$. Therefore, the density of spacer layer 800 on outer surfaces 910 is about 4 times higher than that on inner surfaces 915. In some embodiments, the dielectric constant values in the profiles shown in FIGS. 12E and 12F range between about 2.5 and about 7. Therefore, the dielectric constant of spacer layer 800 on outer surfaces 910 is about 2.8 times higher than that on inner surfaces 915.

Similar trends to those discussed above can be obtained for a treatment with nitrogen radicals (N*). In some embodiments, N* may include $N_2$* and $NH_2$* species. In some embodiments, similar profiles to those shown in FIGS. 12A-F can be generated for a treatment with N*. According to some embodiments, high-pressure values (e.g., between about 3 Torr and about 5 Torr) produce N*, which are less reactive than nitrogen ions but provide improved treatment conformality. In contrast, low-pressure values (e.g., between about 1 Torr and about 2 Torr) produce nitrogen ions, which are more reactive than N* but have a shallower penetration depth. Therefore, similar to the treatment with oxygen radicals described above, the process pressure can be used to modulate the reactivity and uniformity of the N* treatment.

In some embodiments, modulating the processing pressure during the treatment results in intermediate profile types between the linear profiles shown in FIGS. 12A, 12C, and 12E and the step-function profiles shown in FIGS. 12B, 12D, and 12F. Therefore, the transition between a high value and a low value can be modulated through the process pressure and the resulting dominant oxygen species in the plasma ($O(^3P_2)$ or $O(^1D_2)$).

By way of example and not limitation, a SiOCN spacer layer 800 treated with O* has a silicon concentration between about 5% and about 40%, an oxygen concentration between about 10% and about 20%, a carbon concentration between about 5% and 20%, and a nitrogen concentration between about 10% and about 20% within the spacer cavity (e.g., at location 1105). In contrast, the same SiOCN spacer layer has a silicon concentration between about 5% and about 40%, an oxygen concentration between about 50% and about 60%, a carbon concentration between about 5% and 10%, and a nitrogen concentration between about 5% and about 10% towards outer surface 910.

By way of example and not limitation, a SiOCN spacer layer 800 treated with N* has a silicon concentration between about 5% and about 40%, an oxygen concentration between about 10% and about 20%, a carbon concentration between about 5% and 20%, and a nitrogen concentration between about 10% and about 20% within the spacer cavity (e.g., in location 1105). In contrast, the same SiOCN spacer layer 800 has a silicon concentration between about 5% and about 40%, an oxygen concentration between about 10% and about 20%, a carbon concentration between about 5% and 10%, and a nitrogen concentration between about 30% and about 50% towards outer surface 910.

In some embodiments, during the treatment with O* or N*, notch 905 shrinks and consequently dimension H decreases to H', which can range between about 0.5 nm and less than about 1 nm (e.g., 0.5 nm≤H'<1 nm). In some embodiments, this is attributed to a volume expansion of spacer layer 800 during the treatment with O* or N*. In some embodiments, the aforementioned volume expansion and the subsequent reduction of dimension H to H' is responsible for minimizing the curvature of the etched top surface of spacer layer 800 described in operation 240 below.

In referring to FIG. 2B, method 200 continues with operation 240 and the process of removing treated portions of the spacer material (e.g., spacer layer 800) to form spacer structures 130 shown in FIG. 1. In some embodiments, the removal process includes an etching process that selectively removes oxidized or nitridized portions of spacer layer 800—for example, the portions of spacer layer 800 between outer surfaces 910 and inner surfaces 915 shown in FIG. 11 (e.g., thickness 800t shown on FIG. 10). As discussed above, the high oxygen or nitrogen content of the oxidized or nitridized portions of spacer layer 800 provide the etching selectivity required for their removal. For example, the etching process has a higher etching selectivity towards portions of spacer layer 800 with higher oxygen or nitrogen concentration and lower etching selectivity towards portions of spacer layer 800 with lower oxygen or nitrogen concentration. Therefore, the etching rate of the removal process progressively reduces as the oxygen/nitrogen concentration decreases—e.g., from outer surface 910 towards inner surfaces 915.

Figure 13A:
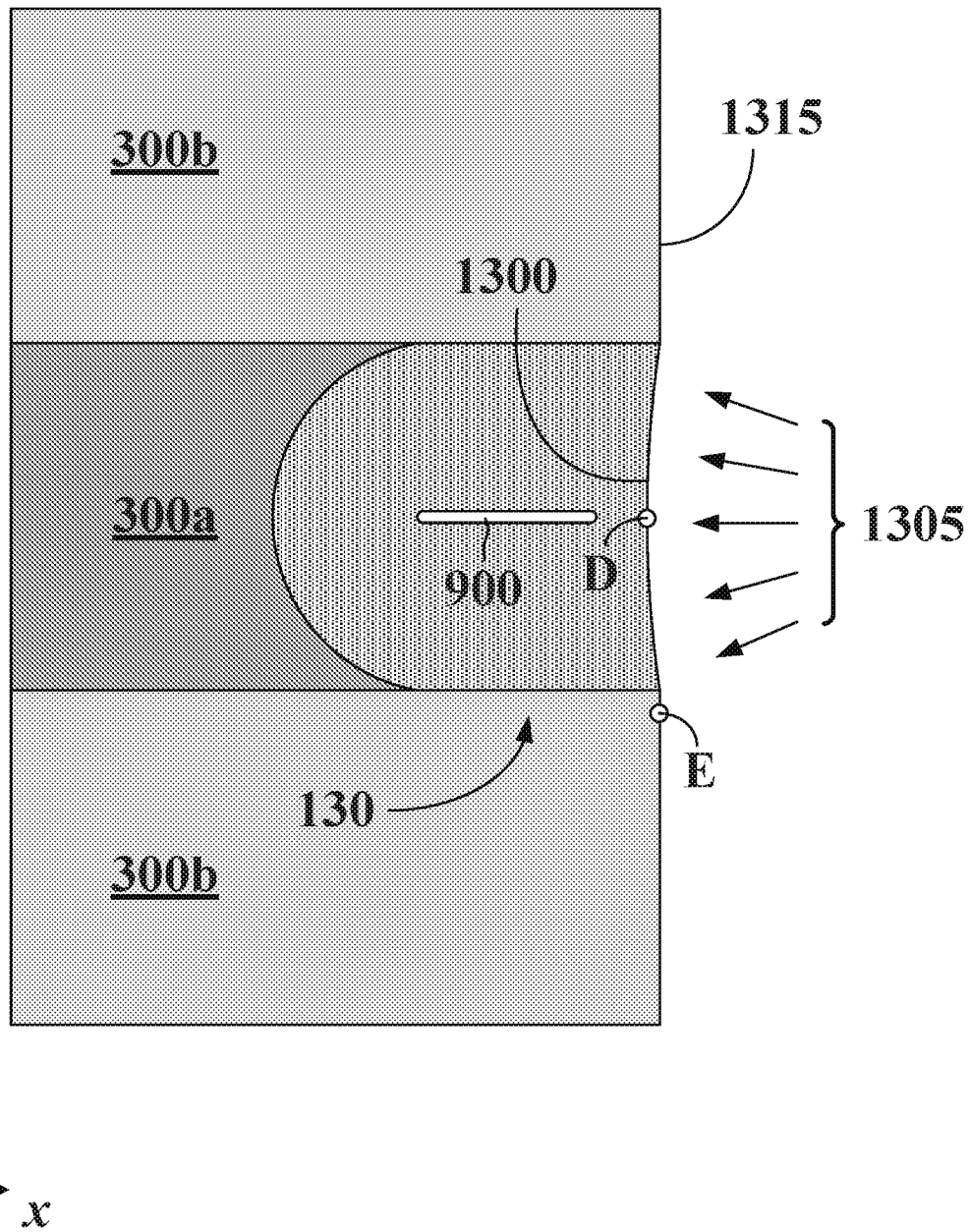
FIGS. 13A and 13B are magnified cross-sectional views of a spacer structure, in accordance with some embodiments.

In some embodiments, FIG. 13A shows the structure of FIG. 11 after operation 240 and the formation of a spacer structure 130. In some embodiments, the etching process of operation 240 is a timed wet etching process with DHF. Due to the etching selectivity discussed above, the etching process is well controlled and spacer layer 800 is not substantially etched within the spacer cavity (e.g., at location 1105) as shown in FIG. 13A. Further, seam 900 is not exposed and remains buried within the spacer cavity.

In some embodiments, etched surface 1300 of spacer structure 130 may not be co-planar with vertical sidewall surfaces 1315 of second NS layer 300b. For example, etched surface of 1300 can have a concave shape (e.g., an inwards curvature) as shown by arrows 1305. In some embodiments, the maximum distance along the x-direction between a point D of etched surface 1300 and a point E on vertical sidewall surfaces 1315 is between about 0.6 nm and about 1 nm. By comparison, if spacer layer 800 was oxidized, for example, with a steam anneal, the removal process of operation 240 would result in a concave etched surface 1300 with a greater curvature where the maximum distance between D and E along the x-direction would be about 2 nm or greater. In some embodiments, an etched surface 1300 with a small curvature is desirable because it reduces the parasitic capacitance formed between gate structure 115 and S/D epitaxial structures 125 shown in FIG. 1. A smaller curvature also ensures that seam 900 will not be exposed in subsequent operations.

Figure 13B:
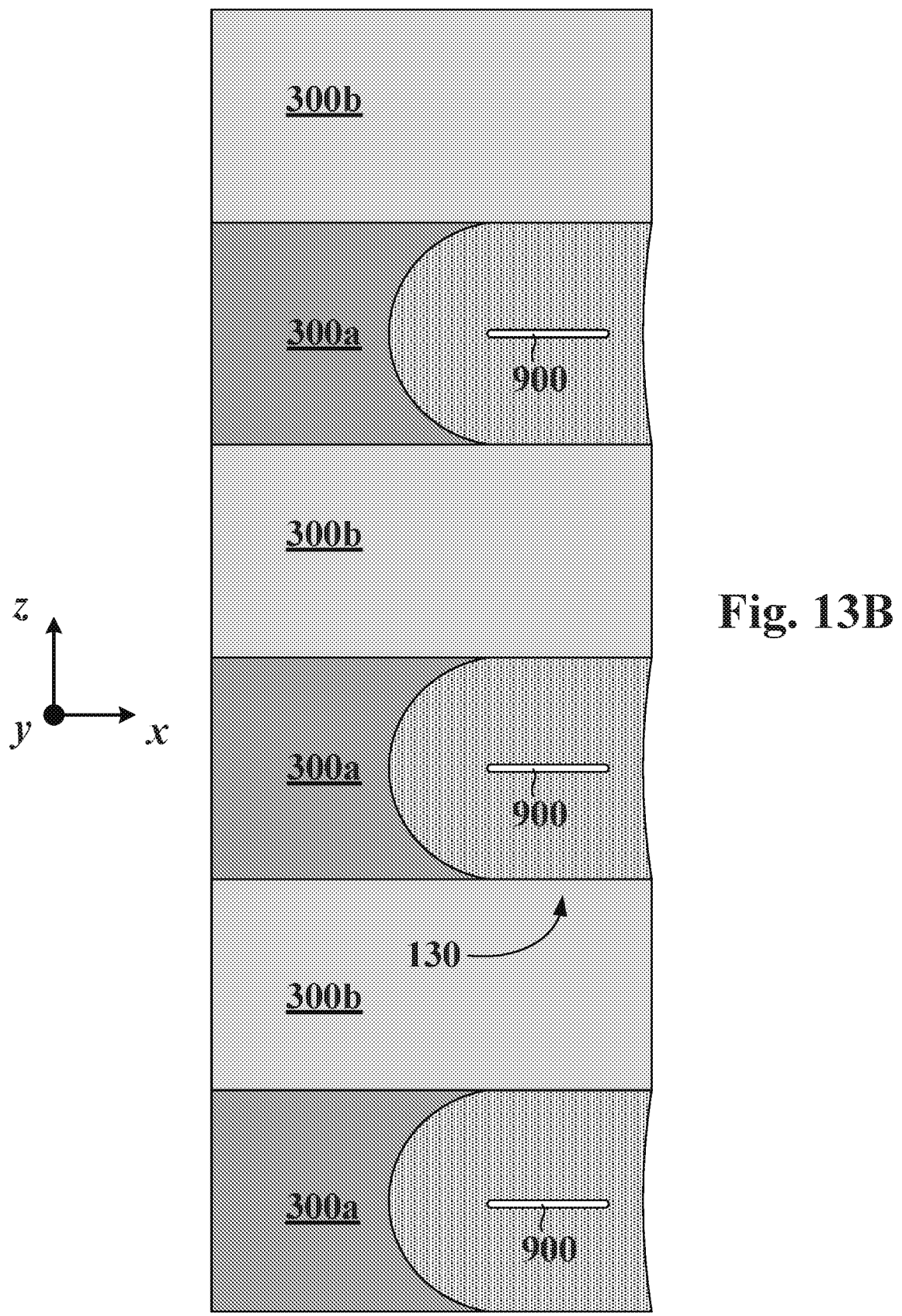

In some embodiments, FIG. 13B shows a zoomed out portion of the structure shown in FIG. 13A, which includes additional first and second NS layers 300a and 300b.

Figure 14:
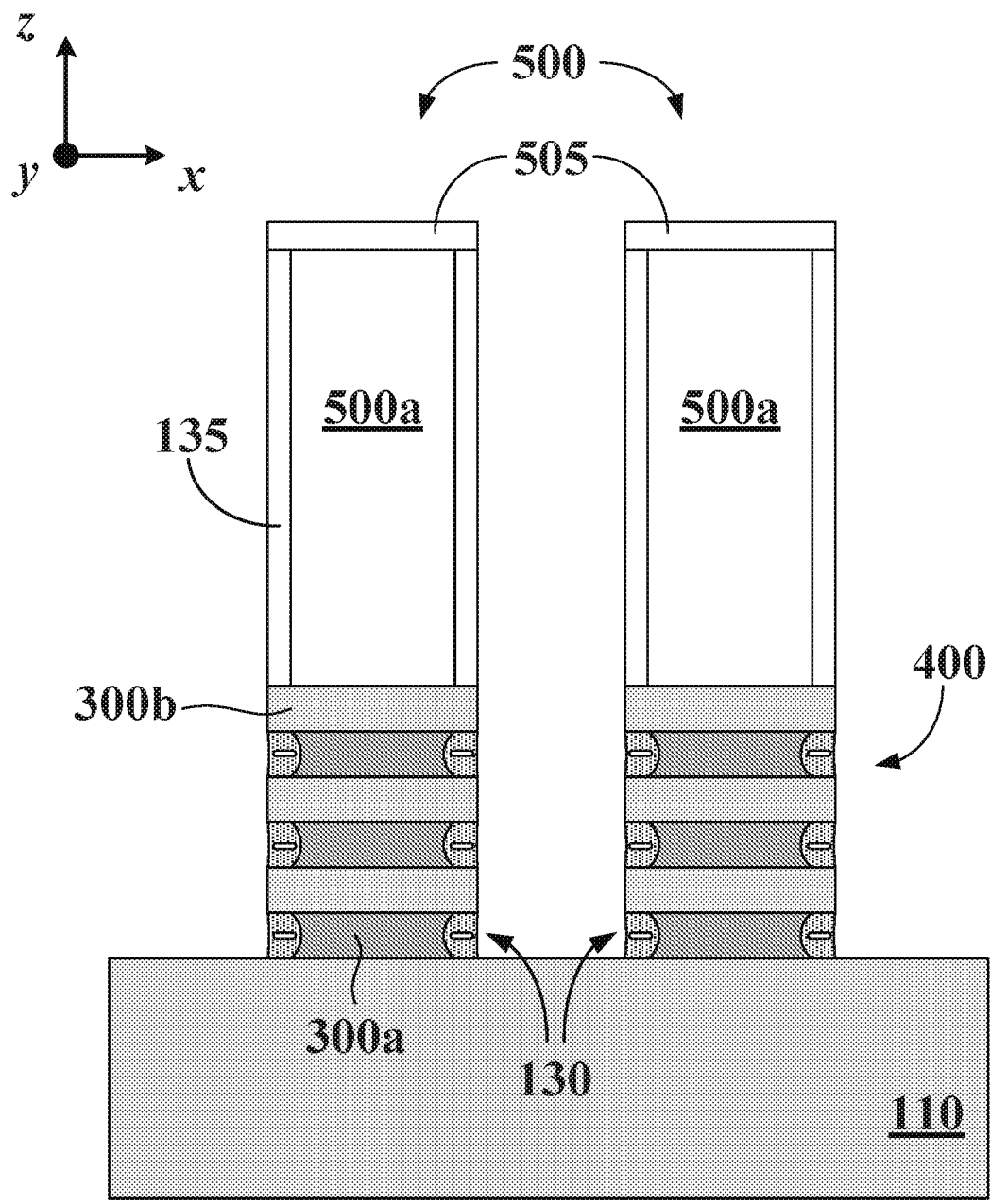
FIGS. 14 through 16 are cross-sectional views of intermediate structures during the fabrication of spacer structures between gate structures and source/drain epitaxial structures of nanostructure transistors, in accordance with some embodiments.

In some embodiments, FIG. 14 shows the structure of FIG. 8 after the removal of treated portions of spacer layer 800 and the formation of spacer structures 130.

Figure 15:
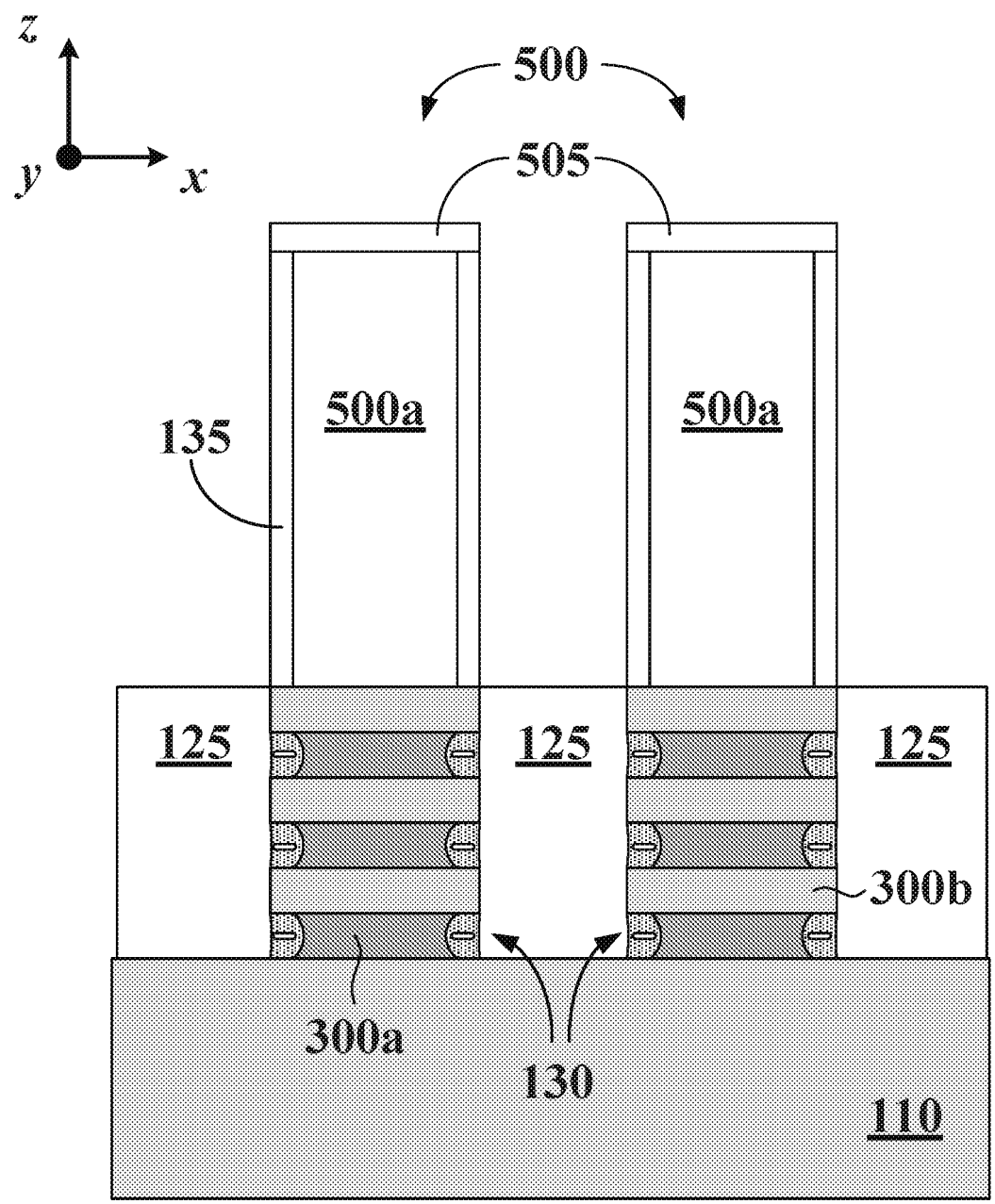

In referring to FIGS. 2B and 15, method 200 continues with operation 245 and the process of forming S/D epitaxial structures 125 abutting fin structures 400. By way of example and not limitation, S/D epitaxial structures 125 are formed directly on exposed top surfaces of substrate 110. In some embodiments, S/D epitaxial structures 125 are grown with a CVD process similar to the one used to form first and second NS layers 300a and 300b. By way of example and not limitation, phosphorous-doped Si S/D epitaxial structures 125 (e.g., appropriate for n-type GAA FETs 100 and 105) can be grown using a silane ($SiH_4$) precursor. The phosphorous dopant can be introduced during growth. In some embodiments, the phosphorous concentration can range from about $1\times10^{21}$ atoms/$cm^3$ to about $8\times10^{21}$ atoms/$cm^3$. The aforementioned doping concentration ranges are not limiting and other doping concentrations are within the spirit and the scope of this disclosure.

By way of example and not limitation, boron doped SiGe S/D epitaxial structures 125 (e.g., appropriate for p-type GAA FETs 100 and 105) can include two or more epitaxial layers grown in succession and having different Ge atomic percentages and B concentrations. For example, a first layer can have a Ge at. % that ranges from 0 to about 40%, and a B dopant concentration that ranges from about $5\times10^{19}$ atoms/$cm^3$ to about $1\times10^{21}$ atoms/$cm^3$. A second epitaxial layer can have a Ge at. % that ranges from about 20% to about 80%, and a B dopant concentration that ranges from about $3\times10^{20}$ atoms/$cm^3$ to about $5\times10^{21}$ atoms/$cm^3$. Further, a third epitaxial layer can be a capping layer that has similar Ge at. % and B dopant concentrations with the first layer (e.g., 0 to about 40% for Ge, and about $5\times10^{19}$ atoms/cm$^3$ to about $1\times10^{21}$ atoms/cm$^3$ for B dopant). The aforementioned doping concentrations are not limiting and other doping concentrations are within the spirit and the scope of this disclosure.

As discussed above, spacer structures isolate first NS layers 300a from S/D epitaxial structures 125. At the same time, second NS layers 300b are in physical contact with S/D epitaxial structures 125.

Figure 16:
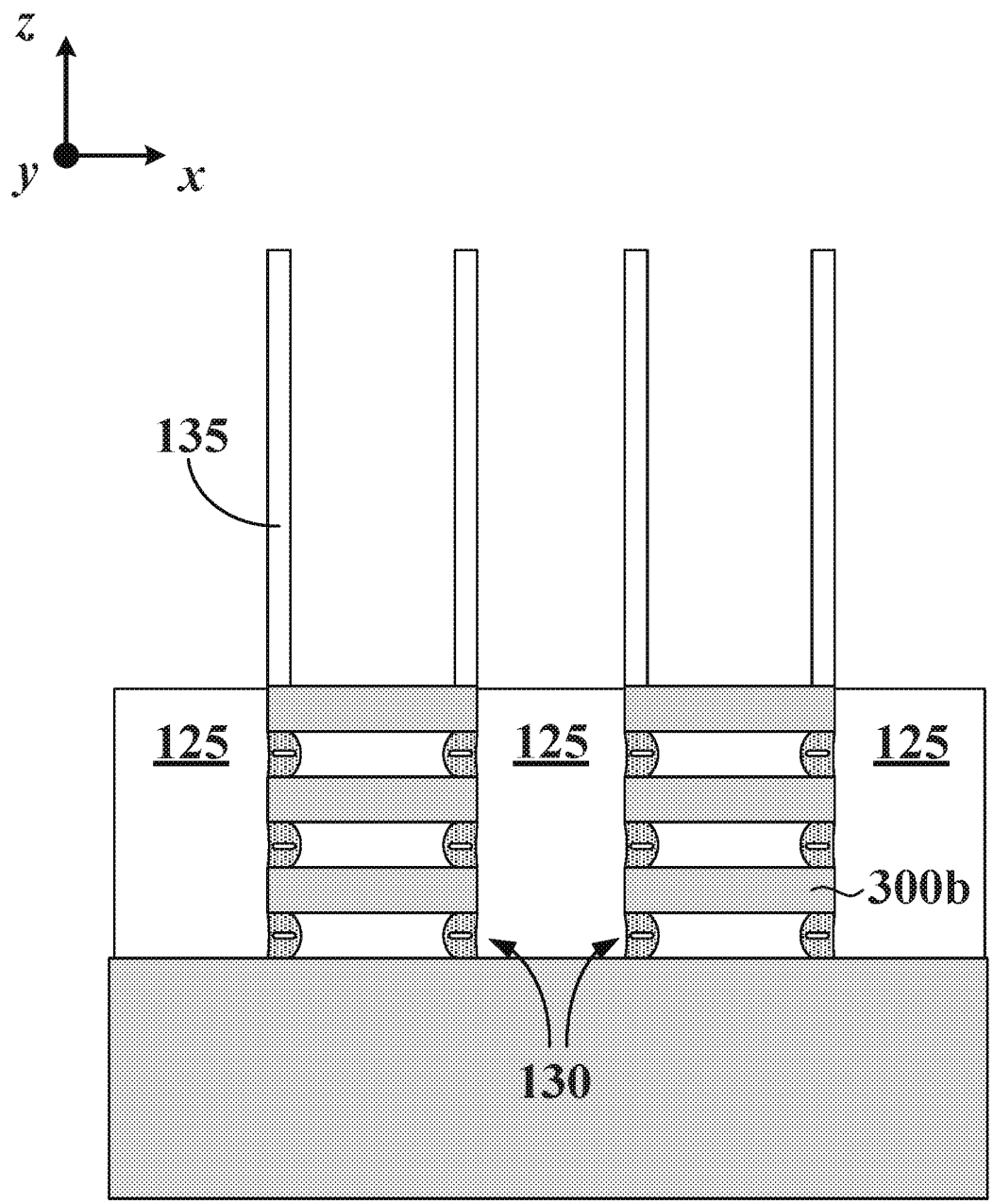

In referring to FIGS. 2B, method 200 continues with operation 250 and the process of removing sacrificial gate structures 500 and first nano-sheet layers 300a from fin structures 400. In some embodiments, capping layer 505 is removed prior to the removal of sacrificial gate structures 500. Subsequently, sacrificial gate structures are removed to expose fin structures 400 between S/D epitaxial structures 125. Later, an etching process selectively removes first NS layers 300a from fin structures 400 without removing second NS layers 300b and spacer structures 130 as shown in FIG. 16.

Figure 17:
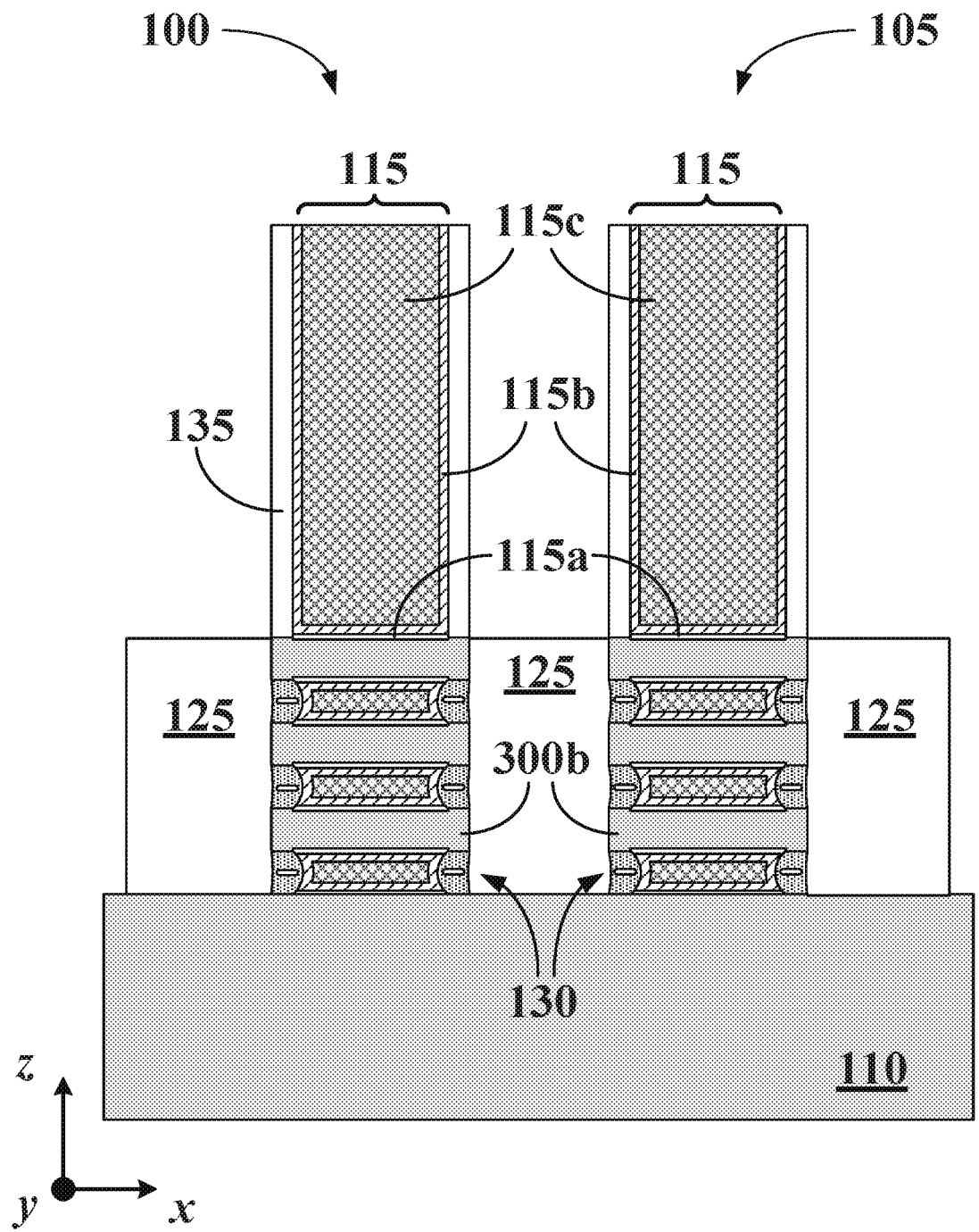
FIG. 17 is a cross-sectional view of nanostructure transistors, in accordance with some embodiments.

In referring to FIGS. 2B, method 200 continues with operation 255 and the process of forming the metal gate structures (e.g., gate structures 115 shown in FIG. 17) to surround second nano-sheet layers 300b of fin structures 400. For example, the layers of the gate structures can sequentially form on the exposed surfaces of second NS layers 300b to form GAA-FETs, such as the GAA-FETs 100 and 105 shown in FIG. 17. As discussed above, the metal gate structures (e.g., like the gate structures 115 shown in FIG. 17) are electrically isolated from S/D epitaxial structures 125 by spacer structures 130. In some embodiments, FIGS. 1 and 17 show identical structures.

In some embodiments, method 200 described above can be used to form spacer structures 130 from a porous or a low-k material (e.g., a carbon-rich silicon oxide based dielectric). For example, spacer layer 800 in FIG. 8 can be a porous or a low-k material, which can be subjected to a treatment with O* or N* and subsequently removed with an etching chemistry to form spacer structures 130 as described above.

The embodiments described herein are directed to a method for the fabrication of spacer structures between S/D epitaxial structures and metal gate structures in GAA fin-FETs. In some embodiments, the method includes treatment of the spacer layer with oxygen or nitrogen radicals using a microwave plasma to form an oxygen or a nitrogen concentration gradient within the spacer layer to be removed. According to some embodiments, the etching selectivity of the treated spacer layer is higher for portions of the spacer material that have a high oxygen or nitrogen concentration and lower for portions of the spacer material that have a low oxygen or nitrogen concentration. In some embodiments, the treatment described herein offers improved oxidation control compared to a steam anneal process or a plasma oxidation process with oxygen ions. In some embodiments, the treatment process with oxygen or nitrogen radicals described herein is performed at a temperature below about 400° C. to prevent Si and SiGe NS or NW layer oxidation. In some embodiments, the treatment process with oxygen or nitrogen radicals described herein can improve the surface curvature of the etched spacer layer. In some embodiments, the treatment process with oxygen or nitrogen radicals described herein is applicable low-k or porous spacer materials to form low-k or porous spacer structures.

In some embodiments, structure includes a substrate and a pair of S/D epitaxial structures formed on the substrate. The structure further includes nanostructure elements between the pair of S/D epitaxial structure, where the nanostructure elements are separated from each other by layers of a gate structure and by spacer structures interposed between the layers of the gate structure and each S/D epitaxial structure of the pair of S/D epitaxial structure. In addition, a distance between a point on a vertical surface of the spacer structures abutting the S/D epitaxial structures and a point on vertical sidewall surfaces of the nanostructure elements is between about 0.6 nm and about 1 nm.

In some embodiments, a method includes forming a fin structure with alternating first and second nanostructure elements on a substrate. In addition, the method includes forming a sacrificial gate structure over the fin structure so that edge portions of the fin structure are not covered by the sacrificial gate structure and removing the edge portions of the fin structure. The method also includes etching edge portions of the first nanostructure elements in the fin structure to form spacer cavities, and depositing a spacer layer on the sacrificial gate structure and the fin structure to fill the spacer cavities. Further, treating the spacer layer with a microwave-generated plasma to form an oxygen concentration gradient in a portion of the spacer layer outside the spacer cavities and removing, with an etching process, the treated portion of the spacer layer outside the spacer cavities. During the etching process, a removal rate of the etching process for the treated portion of the spacer layer is based on an oxygen concentration within the oxygen concentration gradient.

In some embodiments, a method includes forming a fin structure with alternating first and second nanostructure elements on a substrate. In addition, the method includes forming a sacrificial gate structure over the fin structure so that edge portions of the fin structure are not covered by the sacrificial gate structure and removing the edge portions of the fin structure. The method also includes etching edge portions of the first nanostructure elements in the fin structure to form spacer cavities, and depositing a spacer layer on the sacrificial gate structure and the fin structure to fill the spacer cavities. Further, treating the spacer layer with a microwave-generated plasma to form a nitrogen concentration gradient in a portion of the spacer layer outside the spacer cavities and removing, with an etching process, the treated portion of the spacer layer outside the spacer cavities. During the etching process, a removal rate of the etching process for the treated portion of the spacer layer is based on a nitrogen concentration within the nitrogen concentration gradient.

It is to be appreciated that the Detailed Description section, and not the Abstract of the Disclosure section, is intended to be used to interpret the claims. The Abstract of the Disclosure section may set forth one or more but not all possible embodiments of the present disclosure as contemplated by the inventor(s), and thus, are not intended to limit the subjoined claims in any way.

The foregoing disclosure outlines features of several embodiments so that those skilled in the art may better understand the aspects of the present disclosure. Those skilled in the art will appreciate that they may readily use the present disclosure as a basis for designing or modifying other processes and structures for carrying out the same purposes and/or achieving the same advantages of the embodiments introduced herein. Those skilled in the art will also realize that such equivalent constructions do not depart from the spirit and scope of the present disclosure, and that they may make various changes, substitutions, and alterations herein without departing from the spirit and scope of the present disclosure.

What is claimed is:

1. A structure, comprising:
   a substrate;
   a source/drain (S/D) epitaxial structure disposed on the substrate;
   nanostructure elements disposed on the substrate and adjacent to the S/D epitaxial structure;
   a gate structure interposed between the nanostructure elements; and
   a spacer structure interposed between the gate structure and the S/D epitaxial structure, wherein the spacer structure comprises a concave sidewall adjacent to the S/D epitaxial structure, and wherein a ratio of a lateral distance between a first point on the concave sidewall farthest from the S/D epitaxial structure and a second point on the concave sidewall closest to the S/D epitaxial structure to a width of the spacer structure is between about 0.06 and about 0.33.

2. The structure of claim 1, wherein the spacer structure comprises a seam.

3. The structure of claim 1, wherein the spacer structure comprises a silicon-based dielectric with boron and nitrogen.

4. The structure of claim 1, wherein the spacer structure comprises a porous dielectric material.

5. The structure of claim 1, wherein the spacer structure comprises a dielectric material with a dielectric constant between about 2.5 and about 3.9.

6. The structure of claim 1, wherein the lateral distance between the first point on the concave sidewall farthest from the S/D epitaxial structure and the second point on the concave sidewall closest to the S/D epitaxial structure is between about 0.6 nm and about 1 nm.

7. The structure of claim 1, wherein a first oxygen concentration in the spacer structure adjacent to the gate structure is lower than a second oxygen concentration in the spacer structure adjacent to the S/D epitaxial structure.

8. A method, comprising:
   forming alternating first nanostructure elements and second nanostructure elements on a substrate;
   etching edge portions of the first nanostructure elements to form spacer cavities;
   depositing a spacer layer on the first and second nanostructure elements to fill the spacer cavities;
   treating the spacer layer with a microwave-generated plasma to form an oxygen concentration gradient in a portion of the spacer layer outside the spacer cavities; and
   removing, with an etching process, the treated portion of the spacer layer outside the spacer cavities, wherein a removal rate of the etching process for the treated portion of the spacer layer is based on an oxygen concentration within the oxygen concentration gradient.

9. The method of claim 8, wherein treating the spacer layer with the microwave-generated plasma comprises treating the spacer layer with oxygen radicals at a temperature below 400° C.

10. The method of claim 8, wherein treating the spacer layer with the microwave-generated plasma comprises treating the spacer layer with oxygen radicals at a pressure range between about 1 Torr and about 5 Torr.

11. The method of claim 8, wherein treating the spacer layer with the microwave-generated plasma comprises treating the spacer layer with $O(^3P_2)$ and $O(^1D_2)$ radicals.

12. The method of claim 8, wherein treating the spacer layer with the microwave-generated plasma comprises forming a linear oxygen concentration gradient profile with an oxygen atomic percentage between about 10% and about 60%.

13. The method of claim 8, wherein treating the spacer layer with the microwave-generated plasma comprises forming a step-function oxygen concentration gradient profile with an oxygen atomic percentage between about 10% and about 60%.

14. The method of claim 8, wherein treating the spacer layer with the microwave-generated plasma comprises forming a linear oxygen concentration gradient profile with an oxygen atomic percentage higher towards a first sidewall surface of the spacer layer farther from the first and second nanostructure elements and lower towards a second sidewall surface of the spacer layer closer to the first and second nanostructure elements.

15. The method of claim 8, wherein treating the spacer layer with the microwave-generated plasma comprises forming a step-function oxygen concentration gradient profile with an oxygen atomic percentage higher towards a first sidewall surface of the spacer layer farther from the first and second nanostructure elements and lower towards a second sidewall surface of the spacer layer closer to the first and second nanostructure elements.

16. The method of claim 8, wherein treating the spacer layer with the microwave-generated plasma comprises forming a density gradient in the portion of the spacer layer outside the spacer cavities.

17. The method of claim 8, wherein treating the spacer layer with the microwave-generated plasma comprises forming a dielectric constant gradient in the portion of the spacer layer outside the spacer cavities.

18. A method, comprising:
   forming alternating first nanostructure elements and second nanostructure elements on a substrate;
   etching edge portions of the first nanostructure elements to form spacer cavities;
   depositing a spacer layer on the first and second nanostructure elements to fill the spacer cavities;
   treating the spacer layer with a microwave-generated plasma to form a nitrogen concentration gradient in a portion of the spacer layer outside the spacer cavities; and
   removing, with an etching process, the treated portion of the spacer layer outside the spacer cavities, wherein a removal rate of the etching process for the treated portion of the spacer layer is based on a nitrogen concentration within the nitrogen concentration gradient.

19. The method of claim 18, wherein treating the spacer layer with the microwave-generated plasma comprises forming a linear nitrogen concentration gradient profile with a nitrogen atomic percentage between about 10% and about 60%.

20. The method of claim 18, wherein treating the spacer layer with the microwave-generated plasma comprises forming a step-function nitrogen concentration gradient profile with a nitrogen atomic percentage between about 10% and about 60%.

* * * * *